(12) United States Patent
Kunikiyo et al.

(10) Patent No.: US 10,297,624 B2
(45) Date of Patent: May 21, 2019

(54) SEMICONDUCTOR DEVICE

(71) Applicant: RENESAS ELECTRONICS CORPORATION, Tokyo (JP)

(72) Inventors: Tatsuya Kunikiyo, Tokyo (JP); Hidenori Sato, Ibaraki (JP); Yotaro Goto, Ibaraki (JP); Fumitoshi Takahashi, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/934,484

(22) Filed: Mar. 23, 2018

(65) Prior Publication Data

US 2018/0350861 A1    Dec. 6, 2018

(30) Foreign Application Priority Data

Jun. 6, 2017    (JP) .............................. 2017-112086

(51) Int. Cl.
*H01L 27/12*    (2006.01)
*H01L 27/146*    (2006.01)

(52) U.S. Cl.
CPC .. *H01L 27/14609* (2013.01); *H01L 27/14623* (2013.01); *H01L 27/14632* (2013.01)

(58) Field of Classification Search
CPC ......... H01L 27/14609; H01L 27/14623; H01L 27/14632
See application file for complete search history.

(56) References Cited

U.S. PATENT DOCUMENTS 9,472,631 B2 * 10/2016 Hekmatshoartabari ......................
............................................... A61B 5/04001
2004/0104760 A1    6/2004 Ando
2016/0358962 A1 * 12/2016 Chou ................ H01L 27/14645

FOREIGN PATENT DOCUMENTS

JP           08-46145 A      2/1996
JP        2006-024787 A      1/2006

* cited by examiner

*Primary Examiner* — Selim U Ahmed
*Assistant Examiner* — Andre Stevenson
(74) *Attorney, Agent, or Firm* — McDermott Will & Emery LLP

(57) ABSTRACT

A reduction is achieved in the power consumption of a solid-state imaging element including a photoelectric conversion element which converts incident light to charge and a transistor which converts the charge obtained in the photoelectric conversion element to voltage. A photodiode and a charge read transistor which are included in a pixel in the CMOS solid-state imaging element are provided in a semiconductor substrate, while an amplification transistor included in the foregoing pixel is provided in a semiconductor layer provided over the semiconductor substrate via a buried insulating layer. In the semiconductor substrate located in a buried insulating layer region, a $p^+$-type back-gate semiconductor region for controlling a threshold voltage of the amplification transistor is provided.

19 Claims, 29 Drawing Sheets

SEMICONDUCTOR DEVICE

CROSS-REFERENCE TO RELATED APPLICATIONS

The disclosure of Japanese Patent Application No. 2017-112086 filed on Jun. 6, 2017 including the specification, drawings and abstract is incorporated herein by reference in its entirety.

BACKGROUND

The present invention relates to a semiconductor device and to a technique which is effective when applied to a semiconductor device having a solid-state imaging element such as, e.g., a CMOS (Complementary Metal Oxide Semiconductor) image sensor.

For example, Patent Document 1 includes a description of a CMOS solid-state imaging device. Patent Document 1 discloses a technique in which a light reception portion is provided in a semiconductor substrate, an amplification transistor is provided in a semiconductor layer provided over the semiconductor substrate via an insulating layer, and the amplification transistor is formed of a p-channel transistor to improve the linearity of a signal read from the light reception portion.

For example, Patent Document 2 includes a description of a MOSFET using a SOI structure in which a semiconductor layer is provided over an insulator layer. Patent Document 2 discloses a technique which forms a CMOS source follower circuit by setting a source potential over the semiconductor layer in the MOSFET equal to a back-bias potential in a bias electrode in the insulator layer and thus avoiding a substrate bias effect.

For example, Patent Document 3 includes a description of a CMOS source follower circuit provided over a semiconductor substrate. Patent Document 3 discloses a technique which controls the respective threshold voltages of an N-channel transistor and a P-channel transistor in the CMOS source follower circuit using a back-bias voltage control circuit.

RELATED ART DOCUMENTS

Patent Documents

[Patent Document 1] Japanese Unexamined Patent Application Publication No. 2006-24787
[Patent Document 2] Japanese Unexamined Patent Application Publication No. Hei 8(1996)-46145
[Patent Document 3] US Patent Application Publication No. 2004/0104760

SUMMARY

In a solid-state imaging element including a photoelectric conversion element which converts incident light to charge and a transistor which converts the charge obtained in the photoelectric conversion element to voltage, it is expected to reduce power consumption.

Other problems and novel features of the present invention will become apparent from a statement in the present specification and the accompanying drawings.

In a semiconductor device in an embodiment, a first surface of a semiconductor substrate has a first region where a semiconductor layer is provided over the first surface via an insulating layer, and a second region where the insulating layer and the semiconductor layer are not provided over the first surface. In the semiconductor substrate located in the second region, a photoelectric conversion element and a first field effect transistor which are included in a pixel in a solid-state imaging element are provided while, in the semiconductor layer in the first region, a second field effect transistor included in the pixel is provided. In the semiconductor substrate located in the first region, a back-gate semiconductor region for controlling a threshold voltage of the second field effect transistor is provided.

According to the embodiment, it is possible to reduce the power consumption of a solid-state imaging element including a photoelectric conversion element which converts incident light to charge and a transistor which converts the charge obtained in the photoelectric conversion element to voltage.

DETAILED DESCRIPTION

Figure 1:
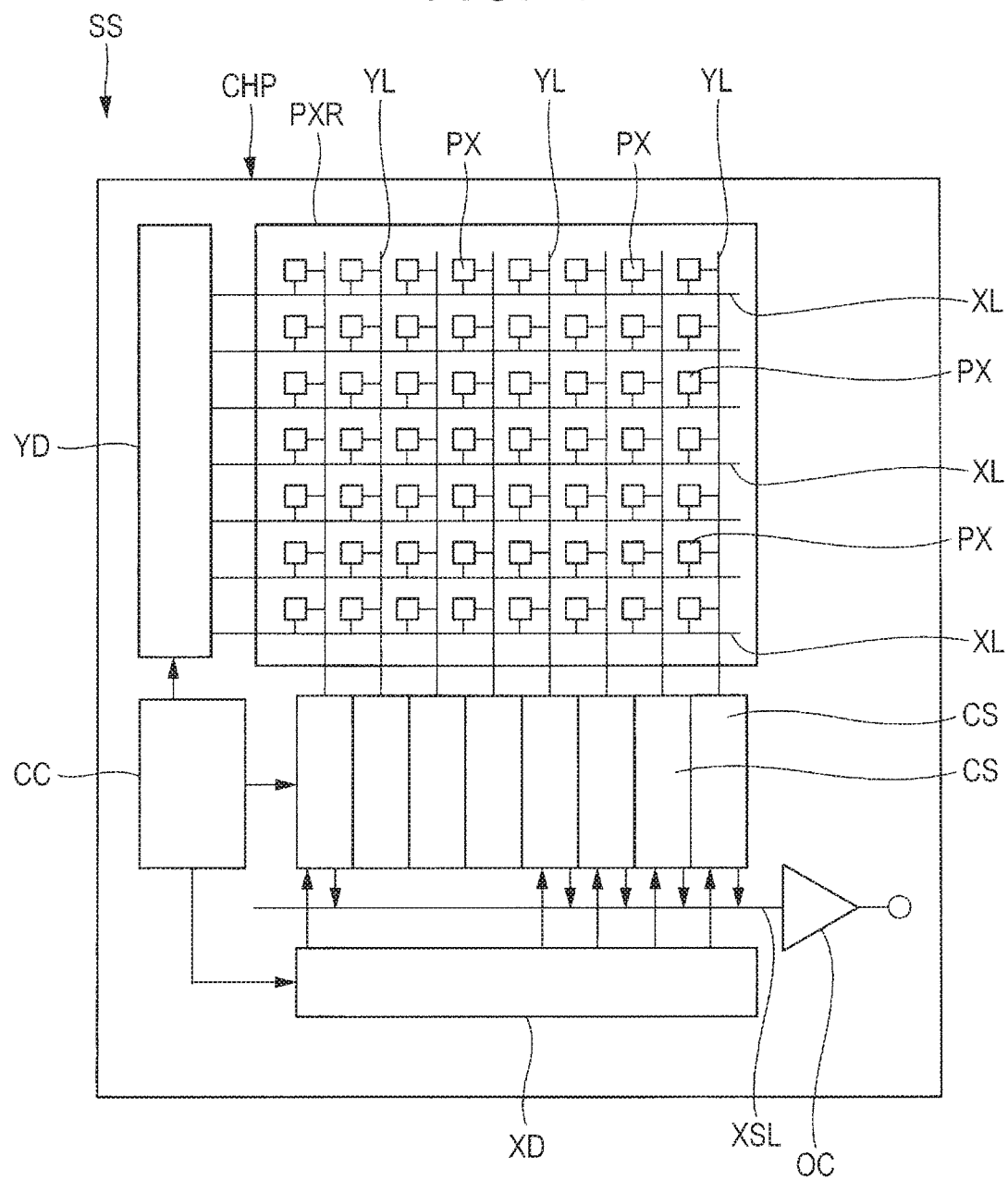
FIG. 1 is an overall schematic configuration diagram of an example of a semiconductor device according to Embodiment 1.

In each of the following embodiments, if necessary for the sake of convenience, the embodiment will be described by being divided into a plurality of sections or embodiments. However, they are by no means irrelevant to each other unless particularly explicitly described otherwise, but are in relations such that one of the sections or embodiments is a modification, details, supplementary explanation, and so forth of part or the whole of the others.

Also, in the following embodiments, when the number and the like (including the number, numerical value, amount, range, and the like) of elements are mentioned, they are not limited to the specific numbers unless particularly explicitly described otherwise or unless they are obviously limited to specific numbers in principle. The number and the like of the elements may be not less than or not more than the specific numbers.

Also, in the following embodiments, it goes without saying that the components thereof (including also elements, steps, and the like) are not necessarily indispensable unless particularly explicitly described otherwise or unless the components are considered to be obviously indispensable in principle.

Likewise, if the shapes, positional relationships, and the like of the components and the like are referred to in the following embodiments, the shapes and the like are assumed to include those substantially proximate or similar thereto and the like unless particularly explicitly described otherwise or unless it can be considered that they obviously do not in principle. The same shall apply in regard to the foregoing numerical value and range.

Note that, throughout all the drawings for illustrating the embodiments, like members are designated by like reference numerals, and a repeated description thereof is omitted. Note that, for improved clarity of illustration, even a plan view may be hatched.

Embodiment 1

<Example of Overall Configuration of Semiconductor Device>

FIG. 1 is an overall schematic configuration diagram of an example of a semiconductor device according to Embodiment 1. Note that X and Y show two directions crossing (preferably at right angles to) each other in plan view. The wording "in plan view" means the case where an object is viewed in a direction perpendicular to the main surface of a semiconductor chip (hereinafter referred to simply as chip) CHP.

The semiconductor device in Embodiment 1 is a solid-state imaging device SS such as, e.g., a CMOS (Complementary MOS) image sensor of a Back Side Illumination (BSI) type. Over the main surface of the chip CHP included in the solid-state imaging device SS, a pixel region PXR, a vertical drive circuit YD, column signal processing circuits CS, a horizontal drive circuit XD, a control circuit CC, an output circuit OC, and the like are disposed.

In the pixel region PXR, a plurality of pixels PX, a plurality of row selection signal lines XL, and a plurality of vertical signal lines YL crossing (at right angles to) the plurality of row selection signals XL are disposed. Each of the pixels PX is a photoelectric conversion circuit which converts light incident on the chip CHP to an electric signal (pixel signal) and is disposed in the vicinity of the point of intersection of the row selection signal line XL and the vertical signal line YL. Each of the row selection signal lines XL is a wire electrically coupling the plurality of pixels PX arranged in the X-direction to the vertical drive circuit YD. The individual row selection signal lines XL are arranged at predetermined intervals in the Y-direction, while extending in the X-direction. Each of the vertical signal lines YL is a wire electrically coupling the plurality of pixels PX arranged in the Y-direction to the corresponding column signal processing circuit CS. The individual vertical signal lines YL are arranged at predetermined intervals in the X-direction, while extending in the Y-direction.

The vertical drive circuit YD successively selects the pixels PX in the pixel region PXR on a per-row basis and is formed of, e.g., a shift register. A selection signal from the vertical drive circuit YD is sent to the plurality of pixels PX through the corresponding row selection signal line XL. Pixel signals from the plurality of pixels PX selected by the vertical drive circuit YD are sent to the corresponding column signal processing circuits CS through the corresponding vertical signal lines YL.

Each of the column signal processing circuits CS retrieves the pixel signals output from the pixels PX included in the corresponding one of the columns on a per-column basis and performs signal processing such as noise removal or signal amplification on the basis of a signal from a black reference pixel region (formed around an effective pixel region, though not shown). Each of the column signal processing circuits CS is disposed correspondingly to one of the columns of the pixels PX. Between the output stage of each of the column signal processing circuits CS and a horizontal signal line XSL, a horizontal selection switch (not shown) is provided. Each of the column signal processing circuits CS is electrically coupled to the horizontal signal line XSL via the horizontal selection switch.

The horizontal drive circuit XD sequentially outputs horizontal scanning pulses to successively select the individual column signal processing circuits CS and cause the individual column signal processing circuits CS to output the pixel signals to the horizontal signal line XSL. The horizontal drive circuit XD is formed of, e.g., a shift register.

The control circuit CC generates a clock signal, a control signal, and the like which serve as bases for the operations of the vertical drive circuit YD, the column signal processing circuit CS, the horizontal drive circuit XD, and the like on the basis of a vertical synchronization signal, a horizontal synchronization signal, and a master clock.

The output circuit OC processes the signals sequentially transmitted from the individual column signal processing circuits CS through the horizontal signal line XSL and outputs the processed signals.

<Example of Circuit Configuration of Pixel>

Figure 2:
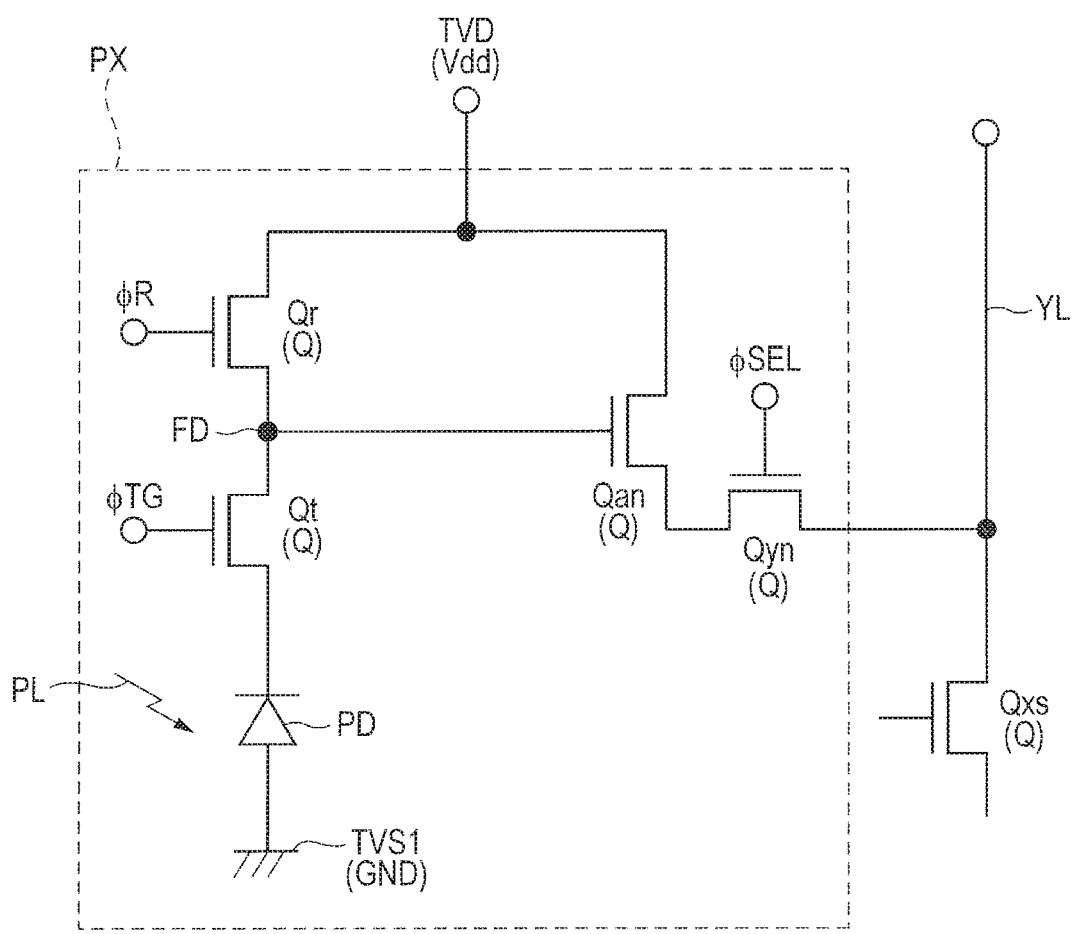
FIG. 2 is a basic equivalent circuit diagram of an example of each of pixels in Embodiment 1.

FIG. 2 is a basic equivalent circuit diagram of an example of each of the pixels in Embodiment 1. The pixel PX includes a photodiode PD and a plurality of pixel transistors Q. The photodiode PD is a photoelectric conversion element which converts incident light PL to charge. The charge resulting from the conversion by the photodiode PD is stored in a junction capacitor of the photodiode PD.

The pixel transistors Q include four transistors, e.g., a charge read transistor (first field effect transistor) Qt, a reset transistor Qr, an amplification transistor (second field effect transistor) Qan, and a vertical selection transistor Qyn. However, a configuration of the pixel transistors Q is not limited thereto and can be changed. For example, the pixel transistors Q may also be configured to include three transistors, e.g., the charge read transistor Qt, the reset transistor Qr, and the amplification transistor Qan.

The charge read transistor Qt reads the charge stored in the photodiode PD and transfers the read charge to a floating diffusion FD. The charge read transistor Qt is formed of, e.g., an n-channel field effect transistor. The reset transistor Qr resets a voltage in the floating diffusion FD to a default value. The reset transistor Qr is formed of, e.g., an n-channel field effect transistor. The reset transistor Qr, the charge read transistor Qt, and the photodiode PD are coupled in series between a power supply terminal TVD and a reference terminal TVS1. Note that the power supply terminal TVD is intended to supply a higher-potential power supply voltage Vdd, while the reference potential TVS1 is intended to supply a reference-potential (e.g., GND) power supply voltage.

The foregoing floating diffusion FD is a portion corresponding to a middle point between the reset transistor Qr and the charge read transistor Qt which are coupled to each other (region corresponding to an output of the charge read transistor Qt). The floating diffusion FD is electrically coupled to the gate electrode of the amplification transistor Qan. The charge transferred to the floating diffusion FD maintains a voltage having a given value. The amplification transistor Qan is formed of a transistor which serves as an amplifier having a gain of 1 and outputs substantially the same voltage as a gate voltage from the source electrode thereof. The drain electrode of the amplification transistor Qan is coupled to the ground (to the power supply terminal TVD when the amplification transistor Qan is an n-channel field effect transistor or to the reference terminal TVS1 when the amplification transistor Qan is a p-channel field effect transistor). The circuit such as the above is generally referred to as a source follower circuit. The characteristic features of the source follower circuit are a high input impedance and a low output impedance. The high input impedance reduces the influence of the use of the circuit, while the low output impedance allows a larger number of loads to be driven. The source electrode of the amplification transistor Qan is electrically coupled to the vertical signal line YL via the vertical selection transistor Qyn. Note that, to the middle point between the amplification transistor Qan and the reset transistor Qr which are coupled to each other, the power supply terminal TVD is electrically coupled. To one end of the vertical signal line YL, a horizontal selection transistor Qxs is electrically coupled.

When information (pixel signal) is read out of the pixel PX, the reset transistor Qr is turned OFF to bring the floating diffusion FD into a floating state, and then a vertical read pulse φTG is applied to the gate electrode of the charge read transistor Qt. As a result, the charge read transistor Qt is turned ON, and the charge stored in the photodiode PD is transferred to the floating diffusion FD to change a potential in the floating diffusion FD. A signal voltage in the floating diffusion FD is applied to the gate electrode of the amplification transistor Qan and converted by the amplification transistor Qan to a signal current. When a vertical selection pulse φSEL is applied to the gate electrode of the vertical selection transistor Qyn, the vertical selection transistor Qyn is turned ON so that the signal current flows in the vertical signal line YL. Note that the signal current flows into the horizontal signal line XSL through the horizontal selection transistor Qxs brought into a conductive state by a horizontal selection pulse to be output from the output circuit OC (see FIG. 1). At the time of resetting for setting the floating diffusion FD to an initial voltage, a reset pulse φR is applied to the gate electrode of the reset transistor Qr to turn ON the reset transistor Qr.

<Semiconductor Substrate and Example of Structure of Pixel>

Figure 3:
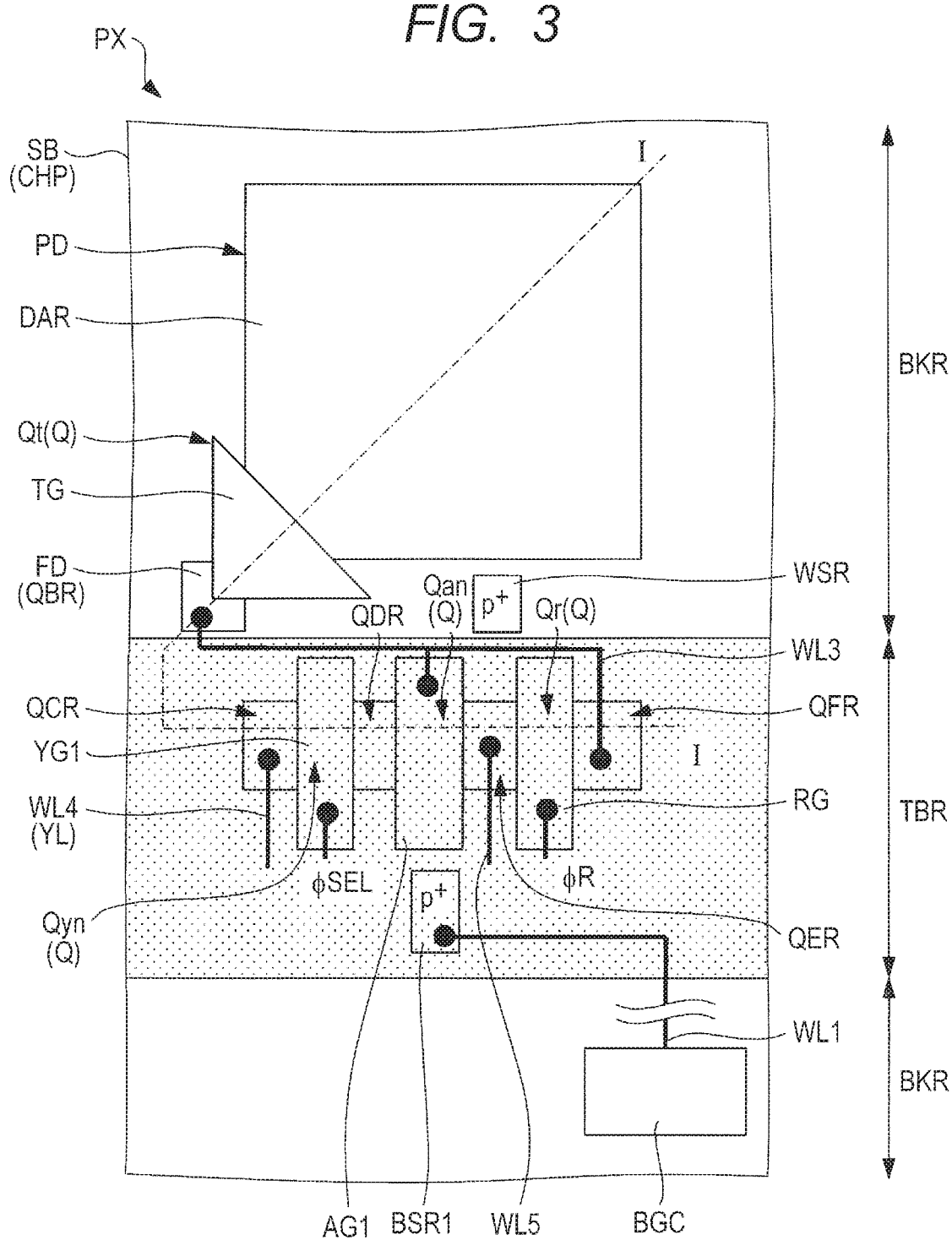
FIG. 3 is an enlarged plan view of each of the pixels in FIG. 1.
Figure 4:
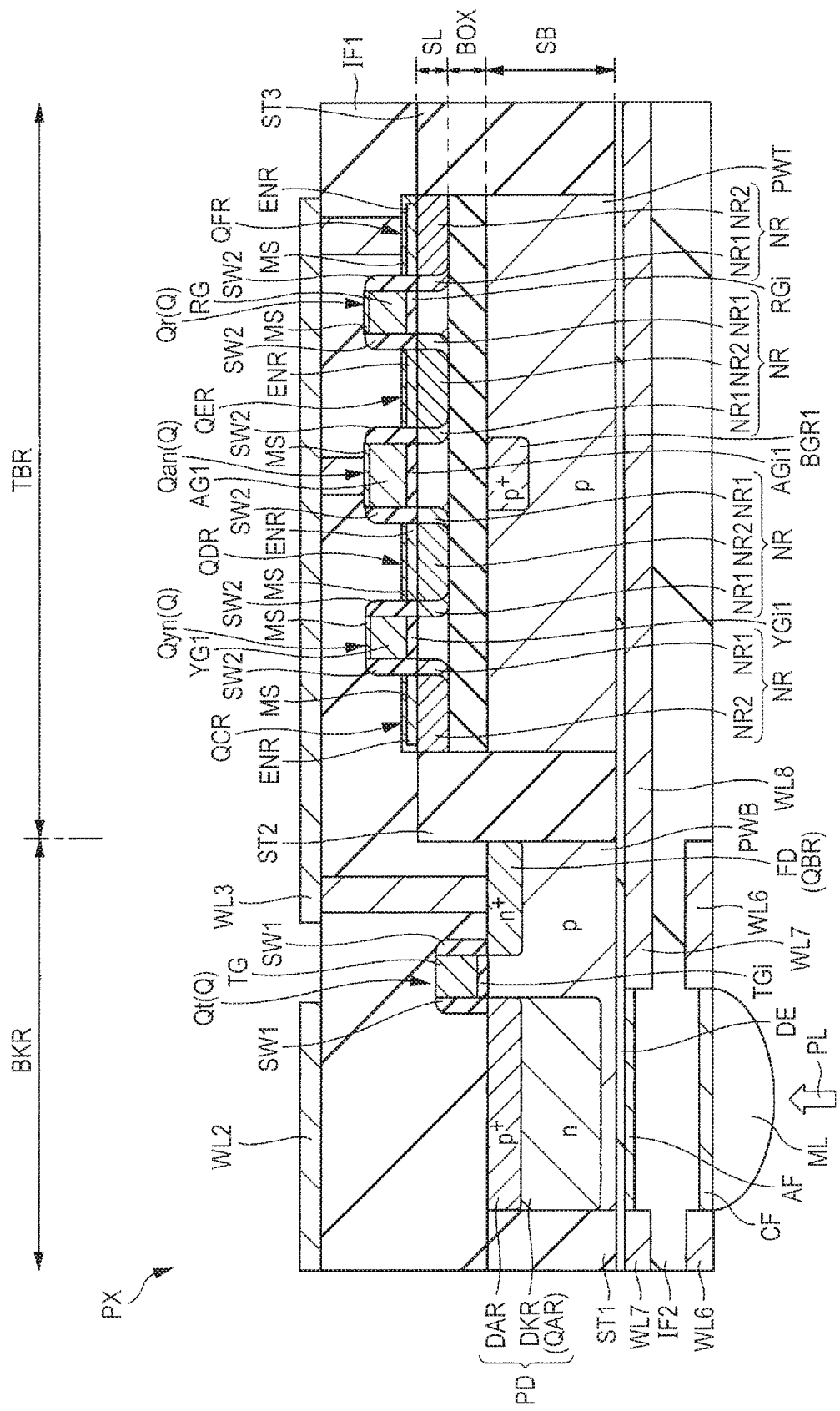
FIG. 4 is a schematic cross-sectional view along the line I-I in FIG. 3.
Figure 5:
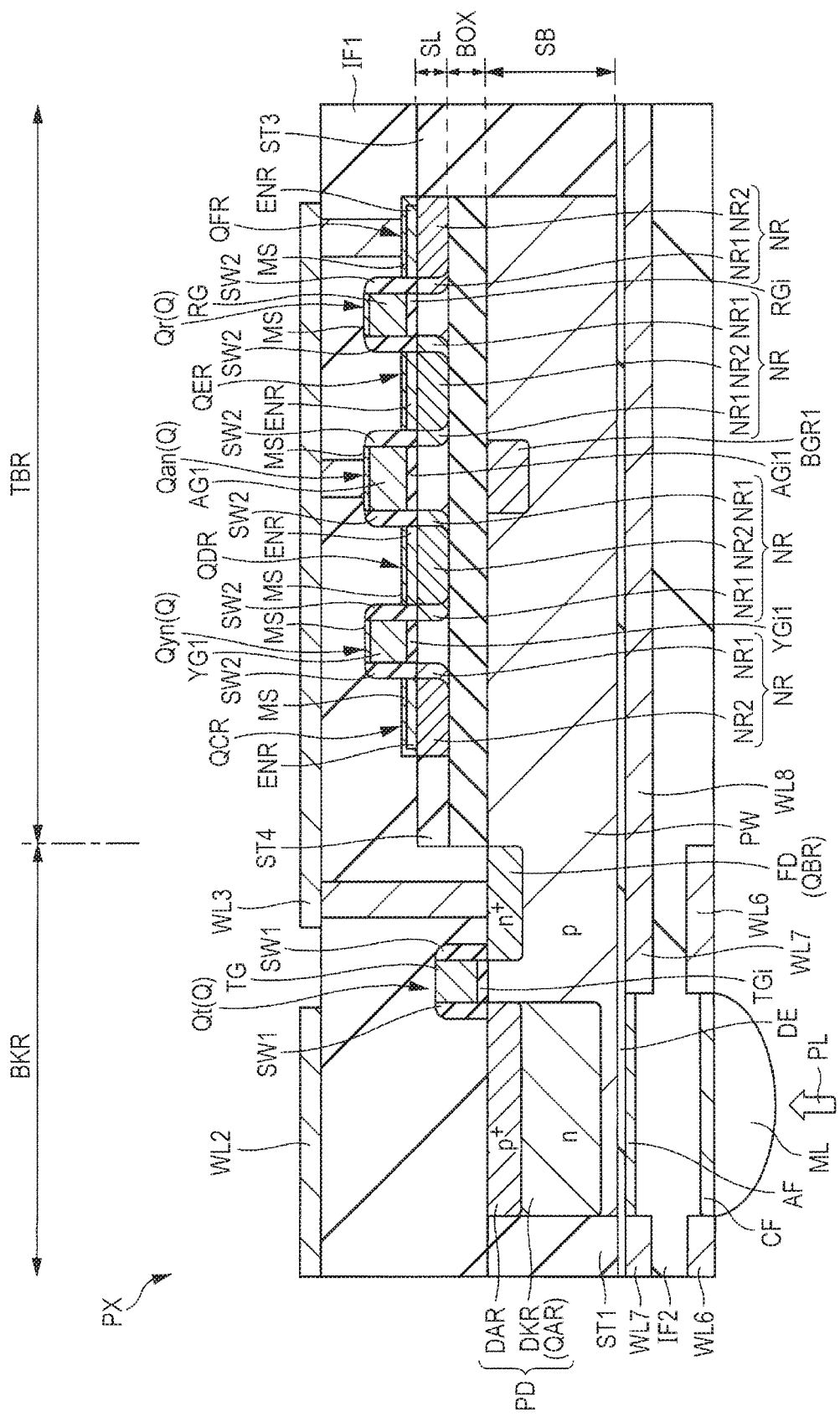
FIG. 5 is schematic cross-sectional view of a modification of FIG. 4 along the line I-I in FIG. 3.

FIG. 3 is an enlarged plan view of each of the pixels in FIG. 1. FIG. 4 is a schematic cross-sectional view along the line I-I in FIG. 3. FIG. 5 is a schematic cross-sectional view of a modification of FIG. 4 along the line I-I in FIG. 3. Note that the wires coupling the amplification transistor Qan and the reset transistor Qr to the floating diffusion FD are off the line I-I, but are illustrated for the convenience of description.

First, a description will be given of a configuration of a semiconductor substrate (hereinafter referred to simply as substrate) SB included in the chip CHP. The substrate SB is made of a thin plate having a quadrilateral shape in plan view and made of, e.g., a silicon (Si) single crystal and has a main surface (first surface) corresponding to the main surface of the chip CHP and a back surface (second surface) opposite to the main surface. In the main surface of the substrate SB, a buried insulating layer region (first region) TBR and a substrate region (second region) BKR are disposed. Note that FIG. 3 is a plan view but, for improved clarity of illustration, the buried insulating layer region TBR is hatched.

In the buried insulating layer region TBR, as shown in FIG. 4, a semiconductor layer SL is provided over the main surface of the substrate SB via a buried insulating layer BOX. That is, the buried insulating layer region TBR has a SOTB (Silicon on Thin Buried Oxide) structure. Since the SOTB structure can suppress a short channel effect using the thin buried insulating layer BOX, it is possible to reduce the impurity introduced into a channel or eliminate the need to introduce an impurity into the channel. Accordingly, it is possible to reduce fluctuations in threshold voltage due to impurity fluctuation and reduce a power supply voltage. In addition, since a body immediately below the gate electrode of the field effect transistor is isolated from the substrate SB by the thin buried insulating layer BOX, it is possible to eliminate a leakage current at the pn junction between each of the source and drain of the field effect transistor and the substrate SB and improve controllability over a voltage in the body. Since the thickness of the thin buried insulating layer BOX is, e.g., about 10 to 30 nm and small, controllability when the voltage in the body is controlled from the substrate SB side can be improved. Also, since the thickness of the thin buried insulating layer BOX is small, an element can be formed even in the substrate SB located in the substrate region BKR. In addition, since the thickness of the semiconductor layer SL is, e.g., about 5 to 30 nm and small, a completely depleted field effect transistor can be provided in the semiconductor layer SL. Moreover, the buried insulating layer BOX can prevent noise produced in the substrate SB from entering the semiconductor layer SL. On the other hand, in the substrate region BKR, the thin buried insulating layer BOX and the semiconductor layer SL are not provided over the main surface of the substrate SB. That is, the substrate region BKR has a single-layer structure made only of the substrate SB. In the substrate region BKR, as will be described later, the photodiode PD described above and the like are disposed.

In the substrate SB, e.g., trench-type isolation portions ST1 to ST3 are formed. For example, the isolation portion ST1 in the substrate region BKR extends from the main surface of the substrate SB and reaches the back surface of the substrate SB. On the other hand, for example, the isolation portions TS2 and ST3 in the buried insulating layer region TBR extend from the main surface of the semiconductor layer SL through the thin buried insulating layer BOX and reaches the back surface of the substrate SB.

The isolation portions ST1 and ST3 are formed so as to surround each of the pixels PX. This can provide electrical isolation between the individual pixels PX. On the other hand, the isolation portion (first isolation portion or third isolation portion) ST2 is formed at the boundary between the buried insulating layer region TBR and the substrate region BKR (to be closer to the buried insulating layer region TBR herein). This can provide electrical isolation between the charge read transistor Qt and each of the other three pixel transistors. The isolation portion ST2 can inhibit or prevent the charge generated in the photodiode PD through photoelectric conversion from moving toward the buried insulating layer region TBR or the charge in the buried insulating layer region TBR from conversely moving toward the substrate region BKR (toward the photodiode PD). This can inhibit or prevent noise from being superimposed on an electric signal resulting from the photoelectric conversion in the photodiode PD.

However, as shown in FIG. 5, it is also possible not to provide the isolation portion ST2 in the substrate SB located at the boundary between the buried insulating layer region TBR and the substrate region BKR. This can allow the substrate region BKR and the buried insulating layer region TBR to share a p-type well PW and omit the steps of individually forming p-type wells in the substrate region BKR and the buried insulating layer region TBR, thus allowing a reduction in product cost. Since the isolation portion ST2 which needs a large width can be eliminated, it is possible to accordingly reduce the area of each of the pixels PX and thus reduce the area of the pixel region PXR. Note that, in FIG. 5, in the semiconductor layer SL at the boundary between the buried insulating layer region TBR and the substrate region BKR, a trench-type isolation portion ST4 is provided.

Next, a description will be given of an example of a configuration of the pixels PX (over the main surface of the substrate SB).

As shown in FIGS. 3 and 4, in the active region of the substrate region BRK which is surrounded by the trench-type isolation portions ST1 and ST2, the photodiode PD, the charge read transistor Qt, the floating diffusion FD, which are described above, and a well power supply region WSR are disposed.

The photodiode PD is a photoelectric conversion element which converts light at a predetermined wavelength to charge. In the case shown herein by way of example, light at green wavelengths is subjected to photoelectric conversion, but the light to be subjected to the photoelectric conversion is not limited thereto. For example, light at red or blue wavelengths, infrared light, or ultraviolet light may also be converted to charge.

As shown in FIG. 3, the photodiode PD is formed in, e.g., a generally quadrilateral shape in plan view. As shown in FIG. 4, in cross-sectional view, the photodiode PD has an n-type semiconductor region DKR formed in a p-type well PWB of the substrate SB and a $p^+$-type semiconductor region DAR formed thereover (in the upper portion of the substrate SB closer to the main surface).

The n-type semiconductor region DKR is the cathode-side region of the photodiode PD. In the n-type semiconductor region DKR, e.g., phosphorus (P) or arsenic (As) is introduced. On the other hand, the $p^+$-type semiconductor region DAR is the anode-side region of the photodiode PD and has the function of storing holes (positive holes) at a high concentration. In the $p^+$-type semiconductor region DAR, e.g., boron (B) is introduced.

The charge read transistor Qt is formed of, e.g., an n-channel field effect transistor and includes a gate electrode TG, a gate insulating film TGi, an n-type source/drain semiconductor region QAR, and an $n^+$-type source/drain semiconductor region QBR.

The gate electrode TG is made of, e.g., a low-resistance polysilicon film. As shown in FIG. 3, the gate electrode TG is disposed at one of the corner portions of the photodiode PD. The gate electrode TG is formed herein in, e.g., a triangular shape in plan view, but the shape of the gate electrode TG is not limited thereto and can be changed to various shapes. The gate insulating film TGi is made of, e.g., a silicon dioxide film and formed between the gate electrode TG and the main surface of the substrate SB. Over the side surfaces of a multi-layer body including the gate electrode TG and the gate insulating film TGi, sidewall spacers SW1 are formed. The sidewall spacers SW1 are made of, e.g., a silicon dioxide film.

The n-type semiconductor region QAR as one of the source/drain regions of the charge read transistor Qt is used also as the n-type semiconductor region DKR of the photodiode PD. The $n^+$-type semiconductor region QBR as the other of the source/drain regions of the charge read transistor Qt serves as the floating diffusion FD described above. In the $n^+$-type semiconductor region QBR, e.g., phosphorus or arsenic is introduced.

The well power supply region WSR shown in FIG. 3 supplies a potential to the p-type well PWB so as to fix the potential in the p-type well PWB of the substrate SB and is disposed in the vicinity of the photodiode PD. The well power supply region WSR is formed of, e.g., a $p^+$-type semiconductor region and is electrically coupled to the p-type well PWB. In the well power supply region WSR, e.g., phosphorus or arsenic is introduced.

On the other hand, as shown in FIGS. 3 and 4, in the active region of the semiconductor layer SL in the buried insulating layer region TBR which is surrounded by the trench-type isolation portions ST2 and ST3, the reset transistor Qr, the amplification transistor Qan, and the vertical selection transistor Qyn, which are described above, and a back-gate power supply region (semiconductor region for supplying a control voltage) BSR1 are arranged side by side along a lateral direction in FIG. 3.

The reset transistor Qr, the amplification transistor Qan, and the vertical selection transistor Qyn are made of, e.g., n-channel field effect transistors and have respective gate electrodes RG, AG1, and YG1, respective gate insulating films RGi, AGi1, and YGi1, and respective $n^+$-type source/drain semiconductor regions QCR, QDR, QER, and QFR.

As shown in FIG. 3, the gate electrodes RG, AG1, and YG1 are formed of respective belt-like patterns extending in a vertical direction in FIG. 3. The gate length (channel length which is the lateral length in FIG. 3) of the gate electrode AG1 of the amplification transistor Qan is larger than the gate length (channel length) of each of the gate electrodes RG and YG1 of the reset transistor QR and the vertical selection transistor Qyn. This can reduce RTS (Random Telegraph Signal) noise. As shown in FIG. 4, each of the gate electrodes RG, AG1, and YG1 is made of, e.g., a low-resistance polysilicon film. In the respective upper portions thereof, silicide layers MS made of, e.g., nickel silicide (NiSi) or the like are formed.

The gate insulating films RGi, AGi1, and YGi1 are made of, e.g., a silicon dioxide film and formed between the gate electrodes RG, AG1, and YG1 and the main surface of the semiconductor layer SL. Note that, over the side surfaces of multi-layer bodies including the gate insulating films RGi, AGi1, and YGi1, the gate electrodes RG, AG1, and YG1, and the silicide layers MS, sidewall spacers SW2 are formed. The sidewall spacers SW2 are made of, e.g., a silicon dioxide film.

Each of the $n^+$-type source/drain semiconductor regions QCR, QDR, QER, and QFR is formed of a stacked structure including an n-type semiconductor region NR formed in the semiconductor layer SL and an $n^+$-type epitaxial layer ENR stacked thereover. The n-type semiconductor region NR includes a lower-impurity-concentration n-type semiconductor region NR1 and a higher-impurity-concentration $n^+$-type semiconductor region NR2. In the surface layer of the $n^+$-type epitaxial layer ENR, the silicide layer MS made of, e.g., nickel silicide (NiSi) or the like is formed. Each of the source/drain regions is formed of the stacked structure by considering that, since the semiconductor layer SL in the case of the SOTB structure is thin as described above, resistance increases and the current flowing in the transistor is reduced by parasitic resistance and that the silicide layer MS cannot satisfactorily be formed in the surface layer of the semiconductor layer SL.

In these $n^+$-type semiconductor regions QCR, QDR, QER, and QFR, e.g., phosphorus or arsenic is introduced. Among them, the $n^+$-type semiconductor region QDR located between the vertical selection transistor Qyn and the amplification transistor Qan is shared by the vertical selection transistor Qyn and the amplification transistor Qan. The $n^+$-type semiconductor region QER located between the reset transistor Qr and the amplification transistor Qan is shared by the reset transistor Qr and the amplification transistor Qan.

Thus, in Embodiment 1, the vertical selection transistor Qyn, the amplification transistor Qan, and the reset transistor Qr are simply arranged side by side in one direction. In addition, in the buried insulating layer region TBR, the $n^+$-type semiconductor regions QDR and QER are shared by the vertical selection transistor Qyn and the amplification transistor Qan which are adjacent to each other and between the amplification transistor Qan and the reset transistor Qr which are adjacent to each other. This can reduce the area occupied by the vertical selection transistor Qyn, the amplification transistor Qan, and the reset transistor Qr. Moreover, since the vertical selection transistor Qyn, the amplification transistor Qan, and the reset transistor Qr are arranged side by side, it is possible to reduce process fluctuation and thus improve the reliability of the operations of the pixel transistors Q.

By providing the amplification transistor Qan included in the source follower circuit in the buried insulating layer region TBR, the amplification transistor Qan is allowed to operate at a low voltage, and therefore the power consumption of the solid-state imaging device SS can be reduced. In addition, since noise from the substrate SB can be blocked by the buried insulating layer BOX, the quality of an image from the solid-state imaging device SS can be improved.

Moreover, since the area occupied by the isolation portions in the buried insulating layer region TBR can be reduced compared to that in the substrate region BKR, by providing the amplification transistor Qan in the buried insulating layer region TBR, it is possible to reduce the area occupied by the pixel transistors Q compared to that in the case where the amplification transistor Qan is provided in the substrate region BKR.

In the buried insulating layer region TBR, in the substrate SB located in the region where the vertical selection transistor Qyn, the amplification transistor Qan, and the reset transistor Qr are disposed, a p-type well (p-type semiconductor region) PWT is formed. In the p-type well PWT, e.g., boron is introduced. In Embodiment 1, in the main surface (in an upper portion of the p-type well PWT) of the substrate SB located in the buried insulating layer region TBR, at the position facing the gate electrode AG1 of the amplification transistor Qan, a $p^+$-type back-gate semiconductor region (back-gate semiconductor region or p-type back-gate semiconductor region) BGR1 is formed. The $p^+$-type back-gate semiconductor region BGR1 is intended to control the threshold voltage of the amplification transistor Qan by applying a predetermined voltage to the body (channel) of the amplification transistor Qan via the thin buried insulating layer BOX. The $p^+$-type back-gate semiconductor region BGR1 is formed so as to overlap the gate electrode AG1 of the amplification transistor Qan in plan view. In the $p^+$-type semiconductor region BGR1, e.g., boron is introduced.

The back-gate power supply region BSR1 shown in FIG. 3 is intended to apply a predetermined voltage to the $p^+$-type back-gate semiconductor region BGR1 described above. The back-gate power supply region BSR1 is preferably disposed at a position away from the photodiode PD. The reason for this is that, when electrons generated in the back-gate power supply region BSR1 (electrons generated irrespective of the presence or absence of the incident light PL) are diffused to enter the photodiode PD, the electrons cause noise. In Embodiment 1, the back-gate supply region BSR1 is disposed in the buried insulating layer region TBR. In addition, the back-gate supply region BSR1 is disposed such that the pixel transistors Q are interposed between the back-gate supply region BSR1 and the photodiode PD. In the back-gate power supply region BSR1, e.g., boron is introduced.

The back-gate supply region BSR1 extends through the buried insulating layer BOX to be electrically coupled to the foregoing p+-type back-gate semiconductor region BGR1. Also, as shown in FIG. 3, the back-gate power supply region BSR1 is electrically coupled to a back-gate control circuit BGC through a wire WL1 in the layer located above the main surface of the semiconductor layer SL. The back-gate control circuit BGC controls the voltage supplied to the back-gate power supply region BSR1 (i.e., the p+-type back-gate semiconductor region BGR1). The back-gate control circuit BGC is disposed in, e.g., the substrate region BKR of the same chip CHP which is located outside the pixel region PXR. However, it may also be possible to dispose the back-gate control circuit BGC in the pixel region PXR or in the buried insulating layer region TBR inside or outside the pixel region PXR.

Over the main surface of the substrate SB thus configured, as shown in FIG. 4, an interlayer insulating film IF1 is deposited so as to cover the photodiode FD, the pixel transistors Q, and the like. The interlayer insulating film IF1 is made of, e.g., a silicon dioxide film and, in the upper surface thereof, the wire WL1 (see FIG. 3), a wire WL2 (see FIG. 4), a wire WL3 (see FIGS. 3 and 4), wires WL4 and WL5 (see FIG. 3), and the like are formed. The wires WL1 to WL5 are formed of, e.g., aluminum (Al), gold (Au), silver (Ag), copper (Cu), chromium silicide (CrSi), or the like.

The wire WL2 has the function of reflecting light which has passed through the photodiode PD from the back surface of the substrate SB toward the photodiode FD and is formed so as to cover the photodiode PD in plan view. The wire WL3 electrically couples the gate electrode AG1 of the amplification transistor Qan and the n+-type semiconductor region QFR as one of the source/drain regions of the reset transistor Qr to the n+-type semiconductor region QBR (floating diffusion FD) as one of the source/drain regions of the charge read transistor Qt. The wire WL4 corresponds to the vertical signal line YL described above and is electrically coupled to the n+-type semiconductor region QCR as one of the source/drain regions of the vertical selection transistor Qyn. The wire WL5 electrically couples the n+-type region QER shared by the amplification transistor Qan and the reset transistor Qr to the power supply terminal TVD.

Next, a description will be given of the back surface side of the substrate SB in each of the pixels PX.

The solid-state imaging device SS in Embodiment 1 is of a BSI type which receives light from the back surface (surface opposite to the surface where the pixel transistors Q and the like are formed) of the substrate SB. Since the back surface of the substrate SB has no level difference and is planar unlike the main surface of the substrate SB, it is possible to prevent vignetting of light or diffuse reflection of light resulting from a level difference. In addition, since it is possible to reduce the influence of the wires W11 to WL5 and the pixel transistors Q, the amount of light incident on the pixels PX in one unit can be increased. It is also possible to inhibit a sensitivity reduction resulting from a change in the incidence angle of the incident light PL. This can improve the efficiency of reception of the incident light PL and thus improve the sensitivity of the solid-state imaging device SS. Consequently, even at a dark place, an image can vividly be sensed.

As shown in FIG. 4, along the path of the incident light PL illuminating the back surface of the substrate SB, a microlens ML, a color filter CF, an interlayer insulating film IF2, an antireflection film AF, and a dielectric film (inhibition layer) DE are disposed herein in this order.

The microlens ML focuses the incident light PL to the photodiode PD. The microlens ML is made of, e.g., a plane-convex lens made of silicon dioxide and disposed with the convex surface thereof facing outward and with the flat surface thereof facing the color filter CF.

The color filter CF transmits light at wavelengths for one of three primary colors of red, green, and blue (which is, e.g., light at green wavelengths) and is disposed so as to overlap the microlens ML in plan view. In plan view, around the outer periphery of the color filter CF, a wire WL6 is formed. The wire LW6 is made of, e.g., aluminum, gold, silver, copper, chromium silicide, or the like and has the function (i.e., the function of a waveguide) of inhibiting the incident light PL from traveling in a direction other than that toward the photodiodes PD of the pixels PX in one unit (optical crosstalk). Accordingly, the thickness of the wire WL6 is larger than the thickness of the color filter CF.

The antireflection film AF has the function of preventing the incident light PL from being diffusely reflected by the back surface of the substrate SB and is formed between the interlayer insulating film IF2 and the dielectric film DE in cross-sectional view so as to overlap the color filter CF in plan view. Around the outer periphery of the antireflection film AF in plan view, a wire WL7 is formed. The wire WL7 is made of the same material as that of the foregoing wire WL6 and has the same function as that of the wire WL6. Note that the interlayer insulating film IF2 is made of, e.g., a silicon dioxide film.

The dielectric film DE is made of, e.g., a hafnium oxide ($HfO_2$) film (film containing Hf and O as main components) or the like and provided so as to cover the entire area of the back surface (of each of the substrate region BKR and the buried insulating layer region TBR) of the substrate SB. The dielectric film DE has a reflection preventing function which inhibits, e.g., the incident light PL illuminating the back surface of the substrate SB from being reflected by the back surface of the substrate SB. The dielectric film DE also has the function of preventing a depletion layer extending from the n-type semiconductor region DKR toward the back surface of the substrate SB due to, e.g., fixed charge formed in the vicinity of the interface between the dielectric film DE and the substrate SB from reaching the back surface of the substrate SB. This can reduce a dark current and dark-time white spots (referred to also as white blemishes) resulting from electrons (electrons generated irrespective of the presence or absence of incident light) released from the interface state of the back surface of the substrate SB. However, the dielectric film DE is not limited to a hafnium oxide film and can variously be modified. The dielectric film DE may be formed of, e.g., a compound of at least one element among zirconium (Zr), aluminum, tantalum (Ta), titanium (Ti), yttrium (Y), and lanthanum (Ln), and oxygen (O).

On the other hand, at the back surface of the substrate SB in the buried insulating layer region TBR, over the dielectric film DE, a wire WL8 is formed so as to cover the entire area of the buried insulating layer region TBR. The wire WL8 has the function of a light shielding layer which prevents light from entering the buried insulating layer region TBR. In the case shown herein by way of example, the wire WL8 is made of the same material as that of the wire WL7 around the outer periphery of the antireflection film AF described above and coupled (formed integrally) to the wire WL7. However, the wire WL8 need not necessarily be coupled (formed integrally) to the wire WL7.

In the solid-state imaging device SS of such a BSI type, the incident light PL illuminating the back surface of the substrate SB is focused by the microlens ML and dispersed by the color filter CF to pass through the dielectric film DE and be incident on the photodiode PD. A portion of the incident light PL passes through the substrate SB to be reflected by the wire WL2 on the main surface side of the substrate SB and enters the substrate SB again. Of the incident light PL that has entered the substrate SB again, a portion is incident on the photodiode PD. Since the reflected light from the wire WL2 is thus retrieved by the photodiode PD, the sensitivity can be improved. Accordingly, as described above, the wire WL2 is preferably formed of a material having a high reflectivity.

As shown in FIG. 2, when the vertical selection transistor Qyn is turned ON to electrically couple the vertical signal line YL to the pixels PX in one unit and the reset transistor Qr is turned ON, a voltage in the floating diffusion FD is reset. As a result, when the threshold voltage of the reset transistor Qr is assumed to be Vthr, the voltage in the floating diffusion FD is set to a value of about (Vdd−Vthr).

As described above, the floating diffusion FD is electrically coupled to the gate electrode AG1 of the amplification transistor Qan. Accordingly, at the time of resetting the floating diffusion FD, a voltage corresponding to (Vdd−Vthr) is applied also to the gate electrode AG1 of the amplification transistor Qan. As a result, the amplification transistor Qan is brought into an ON state, and a reset current flows. However, on the reset current, a signal resulting from photoelectric conversion is not superimposed so that the reset current is useless. That is, power corresponding to the reset current is wasted. Power waste due to this mechanism increases as the number of the pixels increases. In the solid-state imaging device SS, the number of the pixels tends to be increased to increase resolution so that how to suppress the increase in power consumption described above is one of important tasks to be accomplished.

Accordingly, in Embodiment 1, at the time of resetting the floating diffusion FD described above, the back bias to the amplification transistor Qan is adjusted such that a current scarcely flows in the source follower circuit. Specifically, the threshold voltage Vtha of the amplification transistor Qan is set to a high value. That is, a negative voltage is applied to the p$^+$-type back-gate semiconductor region BGR1 of the amplification transistor Qan (when the amplification transistor is a p-channel field effect transistor, a positive voltage is applied to an n$^+$-type back-gate semiconductor region). Since the overdrive of the amplification transistor Qan at the time of the resetting is given by (Vdd−Vth−Vtha), by increasing the threshold voltage Vtha of the amplification transistor Qan, the overdrive is reduced to allow a reduction in reset current. As a result, even when the pixels PX are increased, it is possible to suppress an increase in the power consumption of the solid-state imaging device SS.

Figure 6:
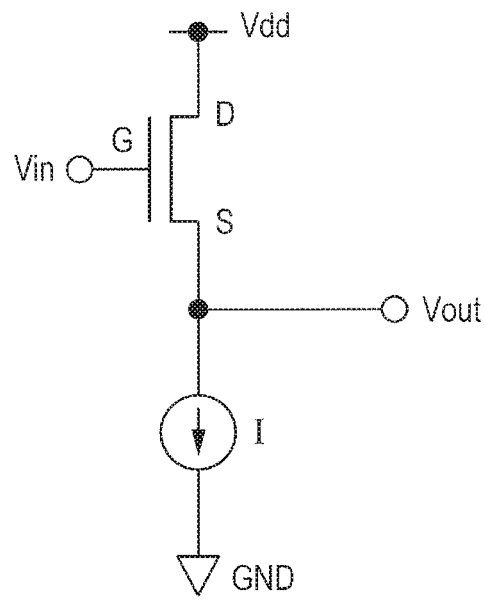
FIG. 6 is a circuit diagram of a typical source follower circuit.
Figure 7:
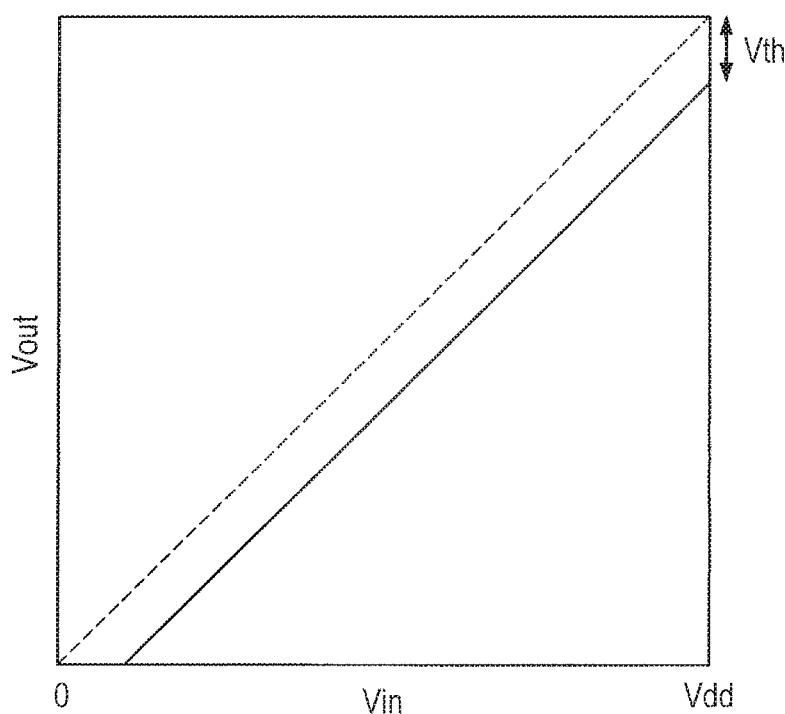
FIG. 7 is a view showing the input/output characteristic of the source follower circuit in FIG. 6.

FIG. 6 is a circuit diagram of a typical source follower circuit. The source follower circuit is applied to the amplification transistor in the solid-state imaging device. When it is assumed that a given current flows from a constant-current power supply and there is no entrance/exit of the current to/from the output, Vout=Vin−Vtha is approximately satisfied (where Vout is an output voltage, Vin is an input voltage, and Vtha is the threshold voltage of the amplification transistor Qan). FIG. 7 shows the input/output characteristic of the source follower circuit in FIG. 6. Ideally, as shown by the broken line, the relationship given by Vout=Vin is established. However, actually, as shown by the solid line, the output voltage Vout is lower than the input voltage Vin by the threshold voltage Vtha of the amplification transistor Qan. This results in an error when charge is read (when signal charge is converted to voltage). In particular, in the solid-state imaging device SS, the input voltage Vin is applied to the gate electrode AG1 of the amplification transistor Qan in proportion to the amount of the incident light, and the voltage is output to the source electrode thereof. When the amplification transistor Qan included in the source follower circuit has an offset voltage equivalent to the threshold voltage Vtha, the output voltage shifts depending on lightness and darkness so that distortion (degradation of an image resulting from a deviation from the ideal relationship given by Vout=Vin) occurs in an image. Hence, in a solid-state imaging device, it is one of the important tasks to be accomplished to be able to vividly sense an image either at a bright place or at a dark place.

Accordingly, in Embodiment 1, during the operation of reading a signal from the pixels PX in one unit, the back bias to the amplification transistor Qan is adjusted such that the input voltage to the amplification transistor Qan included in the source follower circuit is the same as the output voltage therefrom. Specifically, the threshold voltage Vtha of the amplification transistor Qan is reduced to 0 V or to a value lower than 0 V. That is, a positive voltage is applied to the p$^+$-type back-gate semiconductor region BGR1 of the amplification transistor Qan (when the amplification transistor is a p-channel field effect transistor, a negative voltage is applied to the n$^+$-type back-gate semiconductor region). This can prevent the occurrence of a shift of the output voltage from the amplification transistor Qan (offset voltage equivalent to the threshold voltage Vtha) when charge is read from the solid-state imaging device SS. That is, in the amplification transistor Qan, the output voltage proportional to the input voltage can be obtained, and therefore an image free from distortion can be obtained. As a result, either at a bright place or at a dark place, a vivid image can be obtained.

Next, a description will be given of an example of a manufacturing method of the semiconductor device (solid-state imaging device SS) in Embodiment 1.

Figure 8:
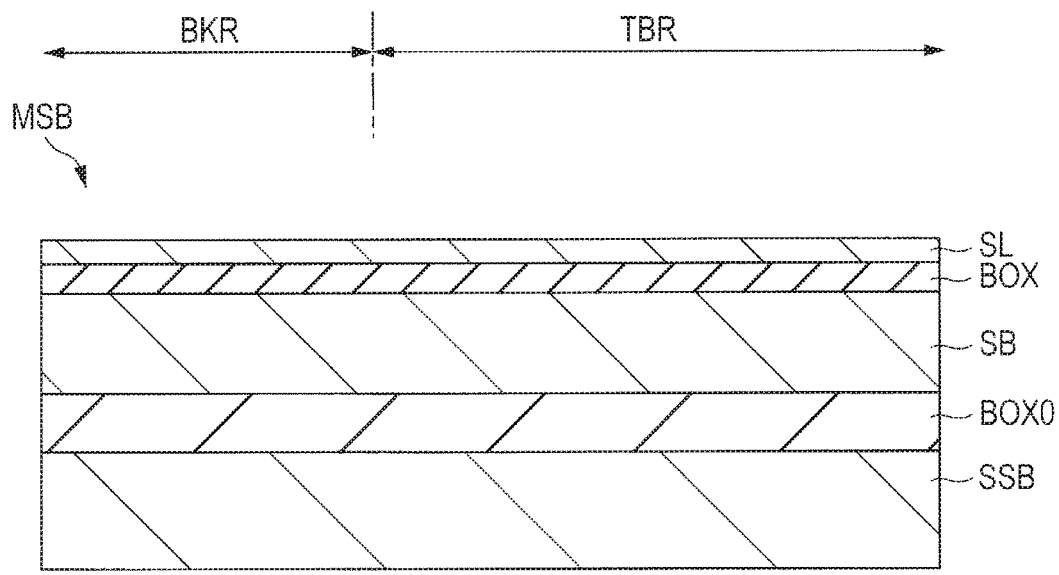
FIG. 8 is a main-portion cross-sectional view of a semiconductor substrate in the manufacturing process of the semiconductor device in Embodiment 1.

First, as shown in FIG. 8, a mother substrate MSB is produced by a lamination method or the like. A supporting substrate SSB of the mother substrate MSB is made of, e.g., a silicon single crystal and, over the main surface thereof, the p-type substrate SB is provided via a buried insulating layer BOX0. Over the main surface of the substrate SB, the p-type semiconductor layer SL is further formed via the buried insulating layer BOX. The thickness of the buried insulating layer BOX is, e.g., about 10 nm to 30 nm. The thickness of the semiconductor layer SL is, e.g., about 5 nm to 30 nm.

Figure 9:
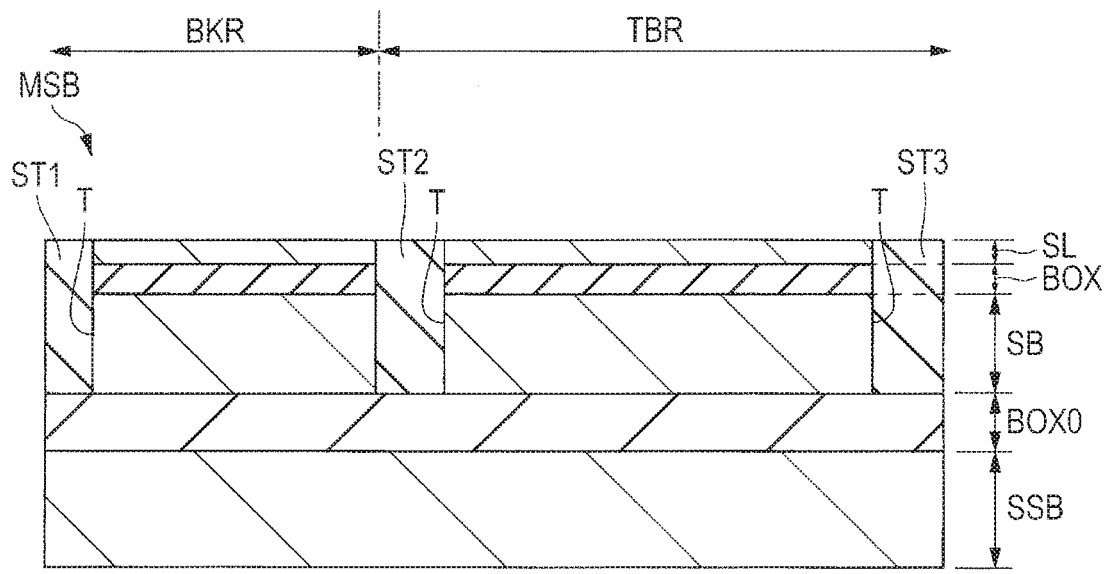
FIG. 9 is a main-portion cross-sectional view of the semiconductor substrate in the manufacturing process of the semiconductor device after the step in FIG. 8.

Subsequently, as shown in FIG. 9, trenches T extending from the main surface of the semiconductor layer SL and reaching the buried insulating layer BOX0 are formed. Then, an insulating film is deposited over the semiconductor layer SL so as to be buried in the trenches T. Then, the upper portion of the insulating film is removed by a CMP (Chemical Mechanical Polishing) method or the like such that the insulating film is left in the trenches T. Thus, the trench-type isolation portions ST1 to ST3 are formed.

Figure 10:
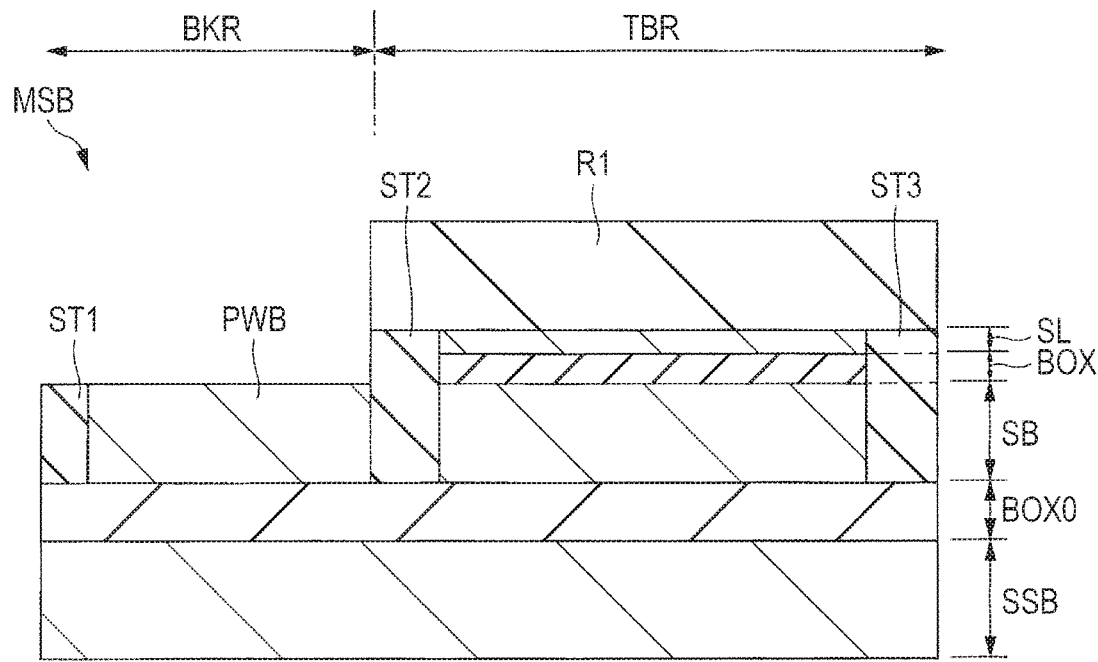
FIG. 10 is a main-portion cross-sectional view of the semiconductor substrate in the manufacturing process of the semiconductor device after the step in FIG. 9.

Next, as shown in FIG. 10, over the semiconductor layer SL, a resist film R1 is formed using a lithographic technique to cover the buried insulating layer region TBR and expose the substrate region BKR. Subsequently, using the resist film R1 as an etching mask, the semiconductor layer SL, the buried insulating layer BOX, and the upper portion of the isolation portion ST1 in the substrate region BKR are removed by etching.

Figure 11:
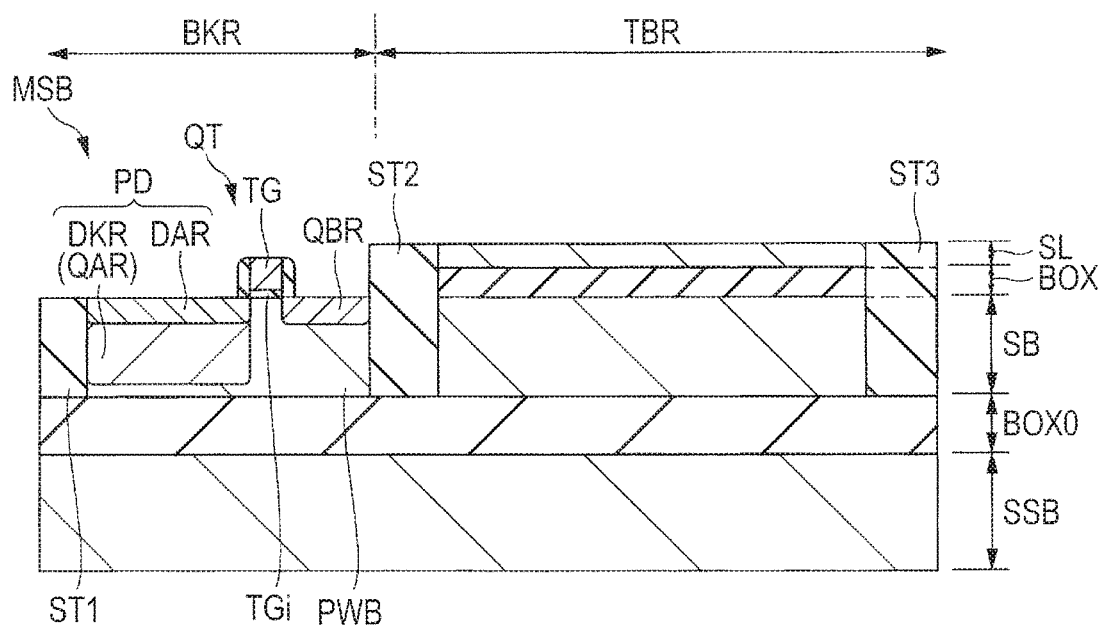
FIG. 11 is a main-portion cross-sectional view of the semiconductor substrate in the manufacturing process of the semiconductor device after the step in FIG. 10.

Next, using the resist film R1 as a mask, boron or the like is ion-implanted into the substrate SB located in the substrate region BKR to form the p-type well PWB, and the resist film R1 is removed. Subsequently, as shown in FIG. 11, over the main surface of the substrate SB, the gate insulating film TGi is formed by a thermal oxidation method or the like, and then the gate electrode TG is formed thereover.

Next, over the main surface of the mother substrate MSB, a resist film (not shown) covering the buried insulating layer region TBR and the region where the floating diffusion FD is to be formed is formed using a lithographic technique. Subsequently, using the resist film and the gate electrode TG as a mask, phosphorus, arsenic, or the like is ion-implanted into the substrate SB to form the n-type semiconductor region DKR (QAR), boron or the like is further ion-implanted to form the $p^+$-type semiconductor region DAR, and the resist film is removed. Thus, the photodiode PD is formed.

Next, over the main surface of the mother substrate MSB, a resist film (not shown) covering the buried insulating layer region TBF and the region where the photodiode is to be formed is formed using a lithographic technique. Subsequently, using the resist film and the gate electrode TG as a mask, phosphorus, arsenic, or the like is ion-implanted into the substrate SB to form the $n^+$-type semiconductor region QBR (floating diffusion FD), and the resist film is removed. Thus, the charge read transistor Qt is formed.

Figure 12:
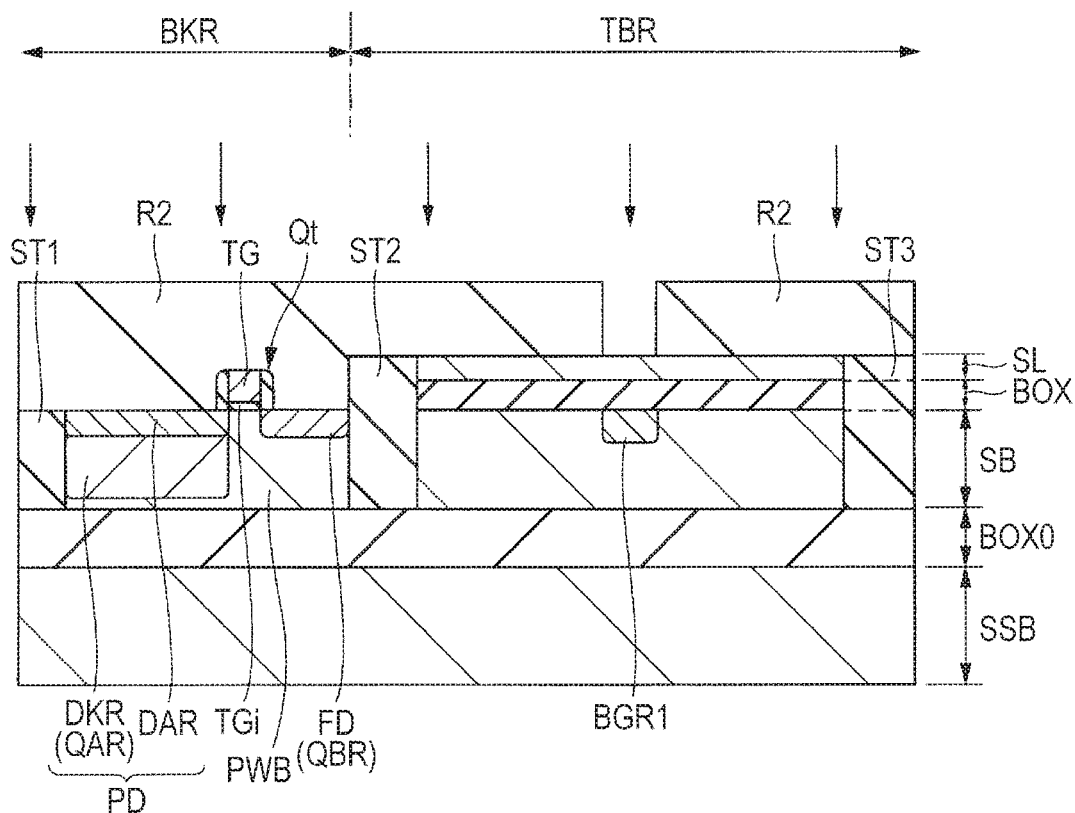
FIG. 12 is a main-portion cross-sectional view of the semiconductor substrate in the manufacturing process of the semiconductor device after the step in FIG. 11.

Next, as shown in FIG. 12, over the main surface of the mother substrate MSB located in the buried insulating layer region TBR, a resist film R2 exposing the back gate formation region and covering the other region is formed using a lithographic technique. Subsequently, using the resist film R2 as a mask, boron or the like is ion-implanted into the substrate SB located in the buried insulating layer region TBR to form the $p^+$-type back-gate semiconductor region BGR1.

Figure 13:
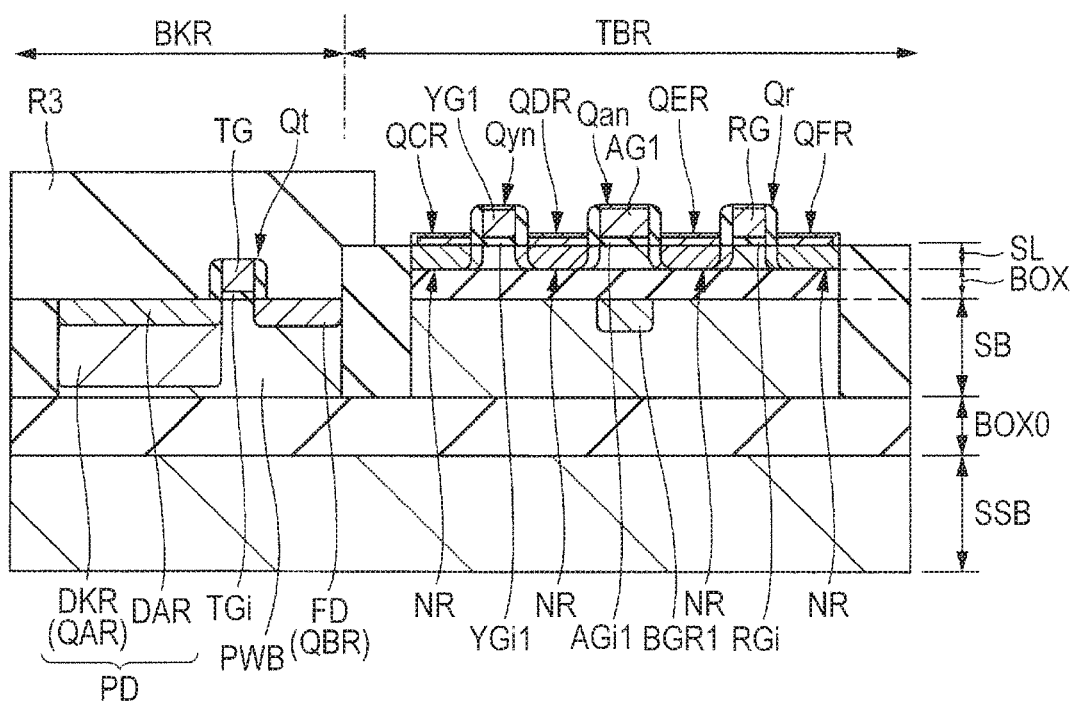
FIG. 13 is a main-portion cross-sectional view of the semiconductor substrate in the manufacturing process of the semiconductor device after the step in FIG. 12.

Next, as shown in FIG. 13, over the main surface of the mother substrate MSB, a resist film R3 exposing the buried insulating layer region TBR and covering the substrate region BKR is formed using a lithographic technique. Subsequently, over the semiconductor layer SL in the buried insulating layer region TBR, the vertical selection transistor Qyn, the amplification transistor Qan, the reset transistor Qr, and the like are formed. That is, after the gate insulating films YGi1, AGi1, and RGi are simultaneously formed over the semiconductor layer SL by a thermal oxidation method or the like, the gate electrodes YG1, AG1, and RG are simultaneously formed thereover. Subsequently, the $n^+$-type source/drain semiconductor regions QCR, QDR, QER, and QFR are formed. The $n^+$-type semiconductor regions QCR, QDR, QER, and QFR are formed by forming the n-type semiconductor region NR in the semiconductor layer SL and then selectively growing an $n^+$-type epitaxial layer over the semiconductor layer SL. Then, by a salicide process, over the upper surfaces of the gate electrodes YG1, AG1, and RG and the top surfaces of the $n^+$-type semiconductor regions QCR, QDR, QER, and QFR, silicide layers are formed.

Figure 14:
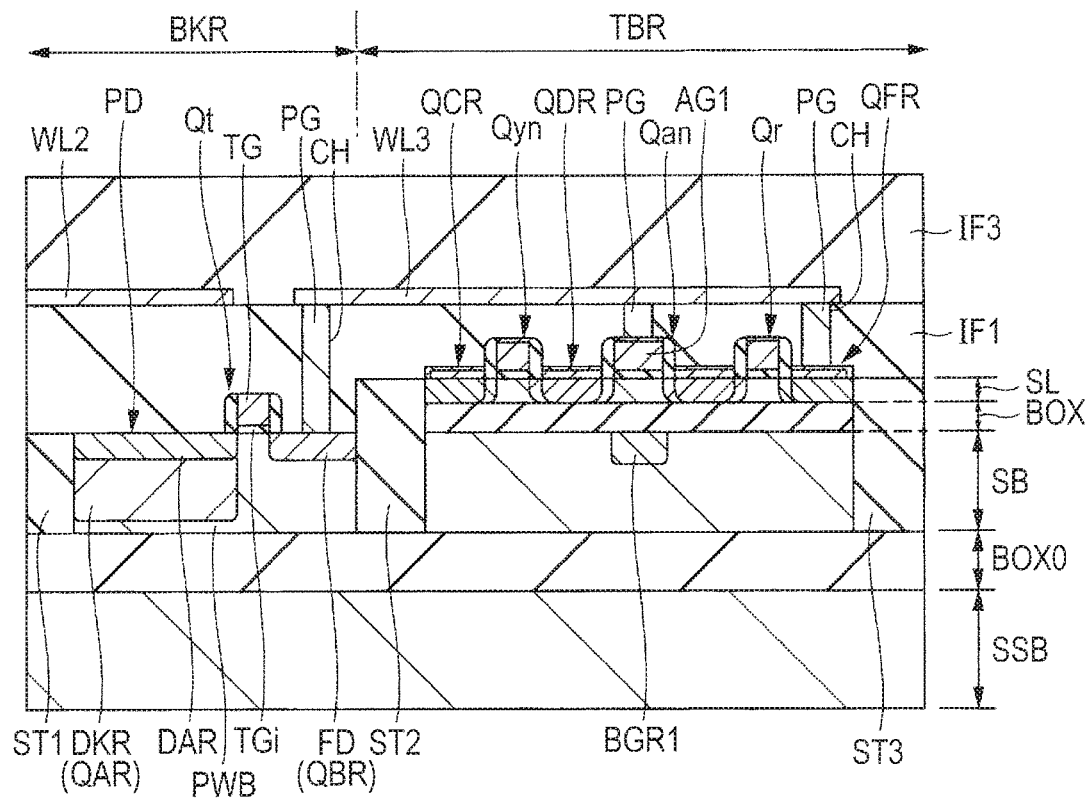
FIG. 14 is a main-portion cross-sectional view of the semiconductor substrate in the manufacturing process of the semiconductor device after the step in FIG. 13.

Next, as shown in FIG. 14, over the main surface of the mother substrate SB, wiring layers are formed. That is, first, over the main surface of the mother substrate SB, the interlayer insulating film IF1 made of, e.g., a silicon dioxide film is deposited by a CVD (Chemical Vapor Deposition) method or the like. Subsequently, in the interlayer insulating film IF1, contact holes CH are formed, and then a metal film made of tungsten or the like is deposited over the interlayer insulating film IF1. Then, the upper portion of the metal film is removed by a CMP method or the like such that the metal film remains in the contact holes CH, thus forming plugs PG in the contact holes CH. Subsequently, over the interlayer insulating film IF1, a metal film is deposited by a sputtering method or the like and then patterned using a lithographic technique and an etching technique to form the wires WL2 and WL3 and the like. Then, over the interlayer insulating film IF1, an interlayer insulating film IF3 is deposited by a CVD method or the like so as to cover the wires WL2 and WL3 and the like.

Figure 15:
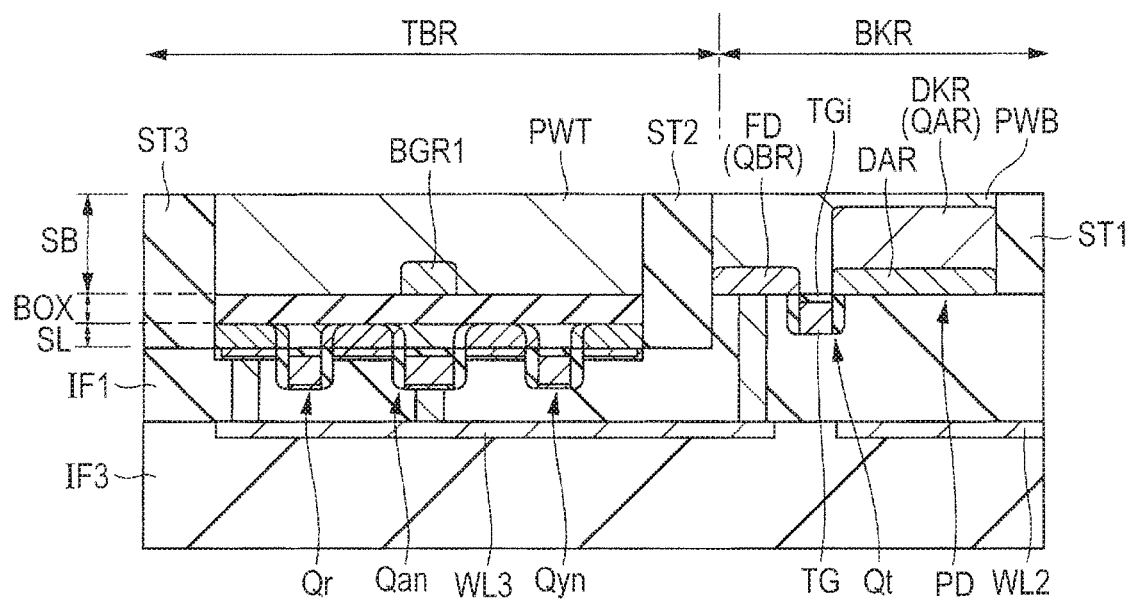
FIG. 15 is a main-portion cross-sectional view of the semiconductor substrate in the manufacturing process of the semiconductor device after the step in FIG. 14.

Next, on the upper surface of the interlayer insulating film IF3, a supporting substrate (not shown) is laminated. Then, the supporting substrate SSB and the buried insulating layer BOX0 under the back surface of the mother substrate MSB are removed by a CMP method or the like. Thus, as shown in FIG. 15, the back surface of the substrate SB is exposed.

Subsequently, as shown in FIG. 4, over the back surface of the substrate SB, the dielectric film DE is formed, and then the wires WL7 and WL8 and the like are formed in the same manner as described above. Between the dielectric film DE and the wires WL7 and WL8 and the like, an insulating film may also be interposed. This can prevent direct contact between the dielectric film DE and the wires WL7 and WL8 and the like and thus eliminate trouble resulting from the contact between the dielectric film DE and the wires W17 and WL8 and the like. It is also possible to prevent the dielectric film DE from being partially removed during patterning for the wires WL7 and WL8 and the like.

Next, under the back surface of the substrate SB, at a position facing the photodiode PD (light reception region surrounded by the wire WL7 in plan view), the antireflection film AF is disposed, and then the interlayer insulating film IF2 is deposited over the dielectric film DE by a CVD method or the like so as to cover the wires WL7 and WL8, the antireflection film AF, and the like. Subsequently, over the interlayer insulating film IF2, the wire WL6 is formed in the same manner as described above, and then the color filter CF and the microlens ML are disposed in this order at a position (light reception region surrounded by the wire WL6 in plan view) under the back surface of the substrate SB which faces the photodiode PD. Then, the supporting substrate over the interlayer insulating film IF3 over the main surface of the substrate SB is removed, thus manufacturing the solid-state imaging device SS.

Note that, in the example described above, the amplification transistor is formed of the n-channel field effect transistor, but the amplification transistor is not limited thereto. The amplification transistor may also be formed of a p-channel field effect transistor.

Embodiment 2

<Example of Circuit Configuration of Pixel Using CMOS Source Follower Circuit>

Figure 16:
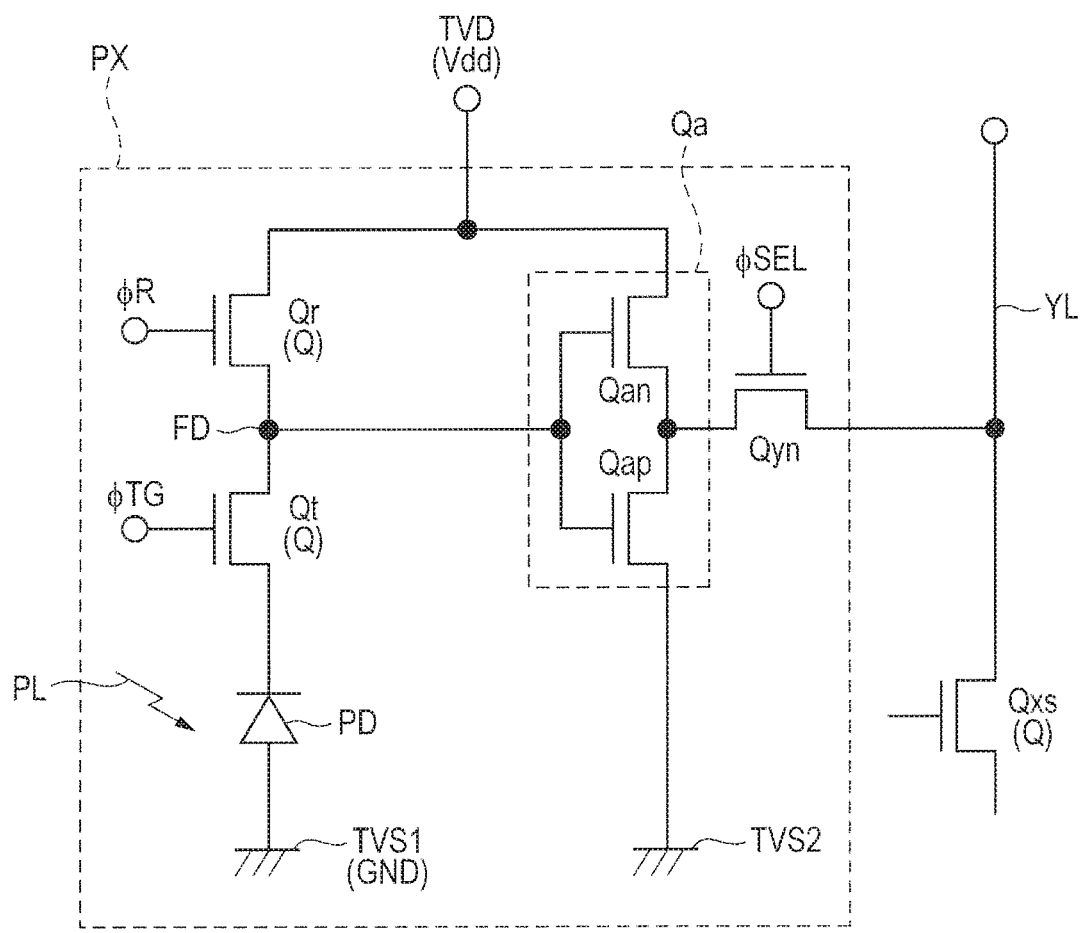
FIG. 16 is a basic equivalent circuit diagram of an example of each of pixels in Embodiment 2.

FIG. 16 is a basic equivalent circuit diagram of an example of each of pixels in Embodiment 2.

In Embodiment 2, the amplification transistor Qa of each of the pixels PX is formed of a CMOS source follower circuit (complementary source follower circuit). That is, the amplification transistor Qa includes the n-channel amplification transistor Qan and a p-channel amplification transistor Qap.

The amplification transistor Qa is coupled in series between the power supply terminal TVD and a reference terminal TVS2. That is, the gate electrode of the n-channel amplification transistor Qan and the gate electrode of the p-channel amplification transistor Qap are electrically coupled to each other to serve as an input terminal of the CMOS source follower circuit. The input terminal of the CMOS source follower circuit is electrically coupled to the output (i.e., the floating diffusion FD) of the charge read transistor Qt. The drain electrode of the n-channel amplification transistor Qan is electrically coupled to the power supply terminal TVD, while the drain electrode of the p-channel amplification transistor Qap is electrically coupled to the reference potential TVS2. The source electrode of the n-channel amplification transistor Qan and the source electrode of the p-channel amplification transistor Qap are electrically coupled to each other to serve as an output of the CMOS source follower circuit. The output of the CMOS source follower circuit is electrically coupled to the vertical selection transistor Qyn. Note that the p-channel amplification transistor Qap is formed of a transistor which serves as an amplifier having a gain of 1 and outputs substantially the same voltage as a gate voltage.

When the CMOS source follower circuit is used, at the time of resetting the floating diffusion FD, a voltage given by (Vdd−Vthr) (Vthr is the threshold voltage of the reset transistor) is applied to the input terminal of the CMOS source follower circuit. The place where the voltage given by (Vdd−Vthr) is applied to the input terminal of the CMOS source follower circuit is nearly at the reference potential (e.g., GND) so that a drain current scarcely flows. This is the advantage of using the CMOS source follower circuit.

<Example of Configuration of Pixel Using CMOS Source Follower Circuit>

Figure 17:
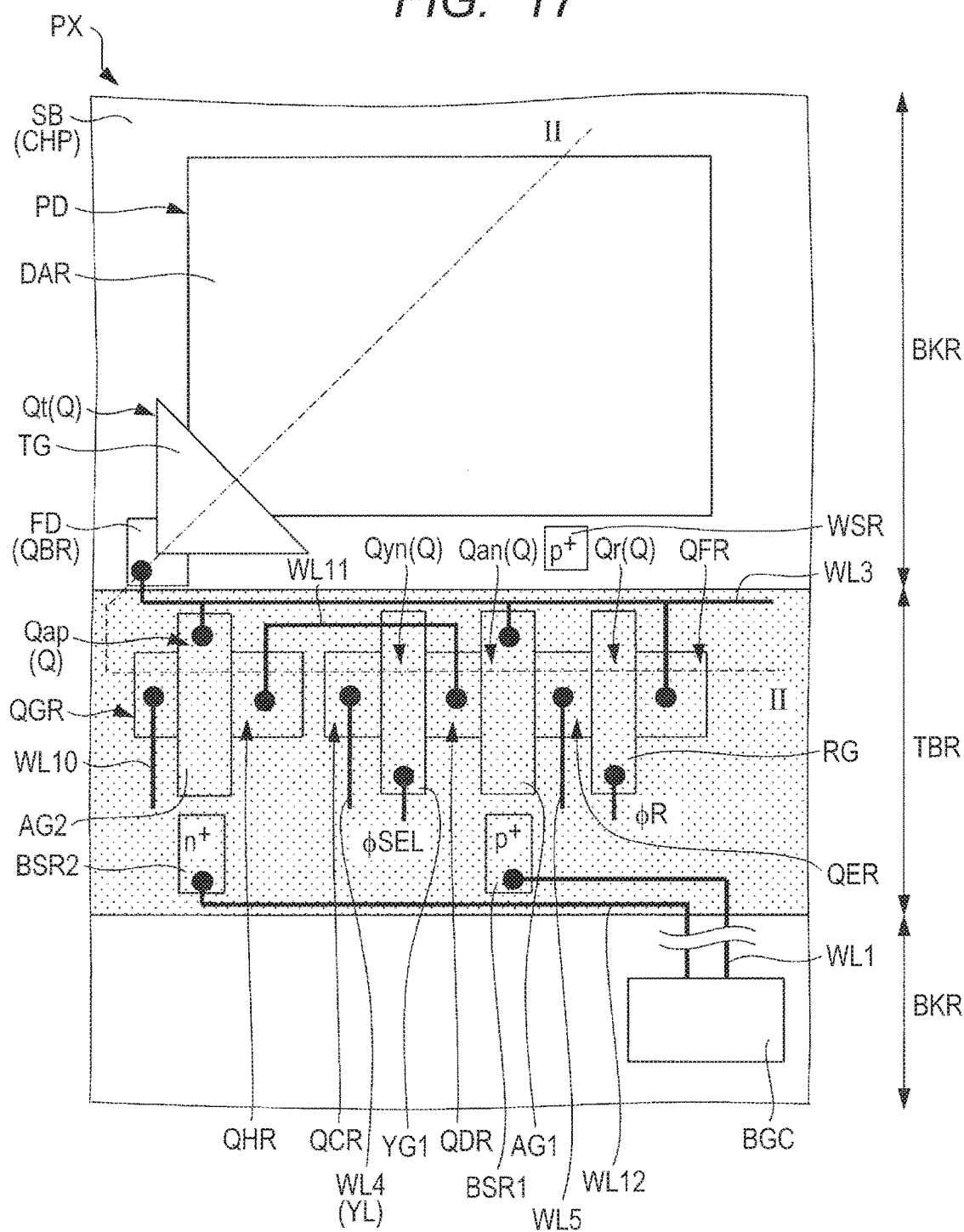
FIG. 17 is an enlarged plan view of the pixel in Embodiment 2.
Figure 18:
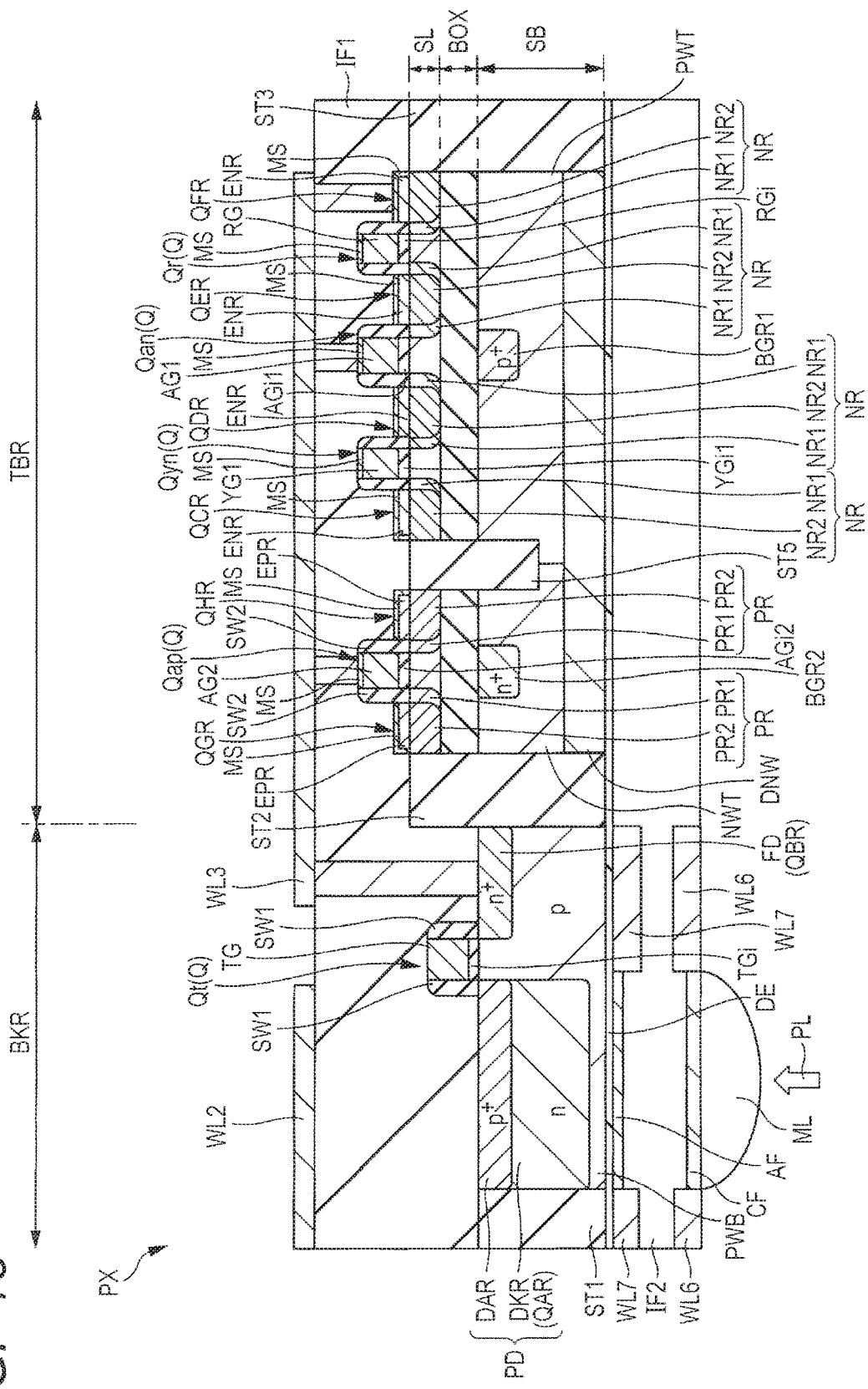
FIG. 18 is a schematic cross-sectional view along the line II-II in FIG. 17.

Next, a description will be given of an example of a configuration of each of the pixels PX. FIG. 17 is an enlarged plan view of each of the pixels in Embodiment 2. FIG. 18 is a schematic cross-sectional view along the line II-II in FIG. 17. Note that the wire WL3 is off the line II-II, but is illustrated for the convenience of description.

In Embodiment 2, as shown in FIGS. 17 and 18, in the semiconductor layer SL in the buried insulating layer region TBR in the structure illustrated in FIGS. 3 and 4, the amplification transistor Qap and a back-gate power supply region BSR2 are additionally disposed in the active regions surrounded by the trench-type isolation portions ST2, ST3, and ST5.

The amplification transistor Qap is made of, e.g., a p-channel field effect transistor and includes a gate electrode AG2, a gate insulating film AGi2, and p$^+$-type source/drain semiconductor regions QGR and QHR.

The structure of the gate electrode AG2 and the gate insulating film AGi2 is the same as that of the foregoing gate electrode AG1 and the foregoing gate insulating film AGi1. The gate electrode AG2 of the amplification transistor Qap is electrically coupled to the gate electrode AG1 of the amplification transistor Qan, the n$^+$-type semiconductor region QFR of the reset transistor Qr, and the n$^+$-type semiconductor region QBR (i.e., the floating diffusion FD) of the charge read transistor Qt through the wire WL3. Note that, over the side surfaces of a multi-layer body including the gate insulating film AGi2, the gate electrode AG2, and the silicide layer MS, the sidewall spacers SW2 (see FIG. 18) are formed.

Each of the p$^+$-type source/drain semiconductor regions QGR and QHR is formed of a stacked structure including a p-type semiconductor region PR formed in the semiconductor layer SL and a p$^+$-type epitaxial layer EPR stacked thereover. The p-type semiconductor region PR includes a lower-impurity-concentration p$^-$-type semiconductor region PR1 and a higher-impurity-concentration p$^+$-type semiconductor region PR2. In the surface layer of the p$^+$-type epitaxial layer EPR, the silicide layer MS is formed. The reason for forming each of the source/drain regions in the stacked structure is as described above. In the p$^+$-type semiconductor regions QGR and QHR thus configured, e.g., boron is introduced.

The p$^+$-type drain semiconductor region QGR of the amplification transistor Qap is electrically coupled to a reference terminal TV2 (see FIG. 16) through a wire WL10 (see FIG. 17). The p$^+$-type source semiconductor region QHR is electrically coupled to the n$^+$-type semiconductor region QDR shared by the amplification transistor Qan and the vertical selection transistor Qyn through a wire WL11 (see FIG. 17), and is electrically coupled to the vertical signal line YL when charge is read. Note that, in this example, the vertical selection transistor Qyn is formed of an n-channel transistor, but can also be formed of a p-channel transistor.

The effect achieved by thus disposing the pixel transistors Q is the same as in Embodiment 1 described above. Also, the effect achieved by providing the amplification transistors Qan and Qap included in the CMOS source follower circuit in the buried insulating layer region TBR is the same as in Embodiment 1 described above.

In Embodiment 2, as shown in FIG. 18, in the substrate SB located in the area of the buried insulating layer region TBR where the amplification transistor Qap is disposed, an n-type well (n-type semiconductor region) NWT is formed. In the n-type well NWT, e.g., phosphorus or arsenic is introduced. The n-type well NWT and the p-type well (p-type semiconductor region) PWT are electrically isolated from each other by the trench-type isolation portion (second isolation portion or fifth isolation portion) ST5 formed therebetween. The trench-type isolation portion ST5 extends from the main surface of the semiconductor layer SL through the buried insulating layer BOX and reaches the substrate SB, but is terminated at a position shallower than the positions where the other trench-type isolation portions ST2 and ST3 are terminated. Under the isolation portion ST5, a pn junction is formed between the p-type well PWT and the n-type well NWT.

Under the n-type well NWT and the p-type well PWT, a deep n-type well DNW is formed. In the deep n-type well DNW, e.g., phosphorus or arsenic is introduced. By providing the deep n-type well DNW, when the back-biases applied to the channels of the amplification transistors Qap and Qan are shifted, it is possible to provide isolation between the n-type well NWT and the p-type well PWT and inhibit or prevent a leakage current between the n-type well NWT and the p-type well PWT. In addition, since the p-type well PT and each of the deep n-type well DNW and the n-type well NWT are insulated from each other at the boundaries therebetween in a direct-current-like (DC-like) manner, noise generated in the n-channel transistor (pixel transistor Q) can be blocked by the deep n-type well DNW.

Also, in Embodiment 2, in the main surface (in an upper portion of the n-type well NWT) of the substrate SB located in the buried insulating layer region TBR, at the position facing the gate electrode AG2 of the amplification transistor Qap, an n$^+$-type back-gate semiconductor region (back-gate semiconductor region or n-type back-gate semiconductor region) BGR2 is formed. The n$^+$-type back-gate semiconductor region BGR2 is intended to control the threshold voltage of the amplification transistor Qap by applying a predetermined voltage to the body (channel) of the amplification transistor Qap via the thin buried insulating layer BOX. The n$^+$-type back-gate semiconductor region BGR2 is formed so as to overlap the gate electrode AG2 in plan view. In the n⁺-type semiconductor region BGR2, e.g., phosphorus or arsenic is introduced.

The back-gate power supply region (semiconductor region for controlling a control voltage) BSR2 shown in FIG. 17 is intended to apply a predetermined voltage to the n⁺-type back-gate semiconductor region BGR2 described above. The back-gate supply region BSR2 is preferably disposed at a position away from the photodiode PD for the same reason as for the foregoing back-gate supply region BSR1, and is disposed similarly to the back-gate supply region BSR1. In the back-gate power supply region BSR2, e.g., phosphorus or arsenic is introduced.

The back-gate supply region BSR2 extends through the buried insulating layer BOX to be electrically coupled to the foregoing n⁺-type back-gate semiconductor region BGR2. The back-gate power supply region BSR2 is also electrically coupled to the back-gate control circuit BGC through a wire WL12 (see FIG. 17) in the layer located above the main surface of the semiconductor layer SL. The back-gate control circuit BGC controls the voltages supplied to the back-gate power supply regions BSR1 and BSR2 (i.e., the p⁺-type back-gate semiconductor region BGR1 and the n⁺-type semiconductor region BGR2). The location of the back-gate control circuit BGC is the same as described above. Also, the configuration other than described above is the same as in Embodiment 1 described above.

Figure 19:
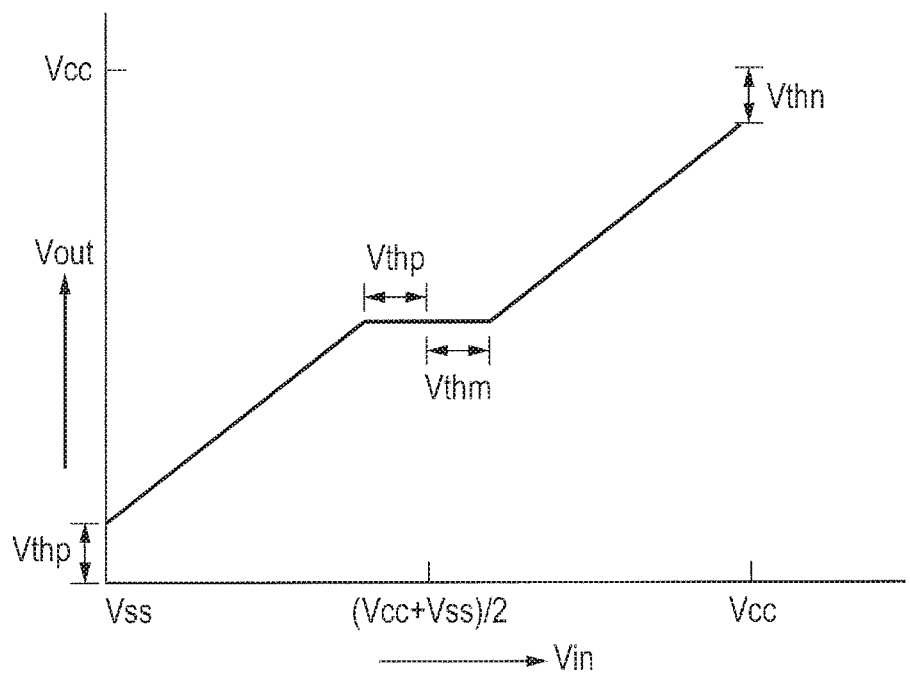
FIG. 19 is a view showing the input/output characteristic of a typical CMOS source follower circuit.

FIG. 19 shows the input/output characteristic of a typical CMOS source follower circuit. The input/output characteristic of the CMOS source follower circuit is generally non-linear due to the threshold voltages of the transistors included in the CMOS source follower circuit. When the input voltage Vin to the CMOS source follower circuit is at a reference potential Vss (equivalent to the ground potential GND), a voltage around a threshold voltage Vthp of the p-channel field effect transistor included in the CMOS source follower circuit is added to the output voltage Vout. On the other hand, when the input voltage Vin is at a power supply potential Vcc (equivalent to the power supply potential Vdd), an offset voltage around a threshold voltage Vthn of the n-channel field effect transistor included in the CMOS source follower circuit is added to the output voltage Vout.

Figure 20:
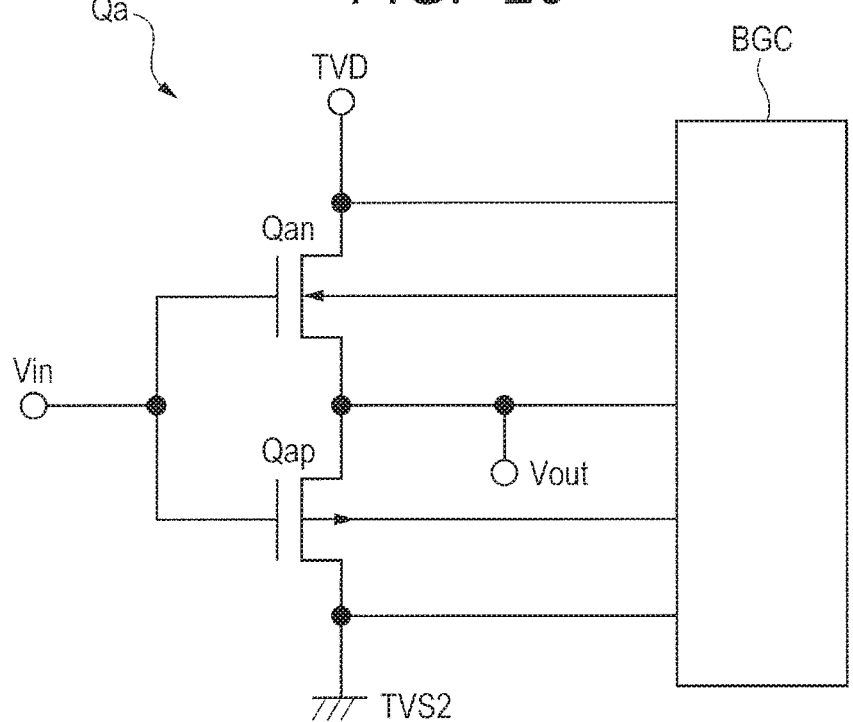
FIG. 20 is a circuit diagram showing an example of coupling between a CMOS source follower circuit of the pixel in Embodiment 2 and a back-gate control circuit.

Accordingly, in Embodiment 2, the back biases to the amplification transistors Qa (Qan and Qap) included in the CMOS source follower circuit are controlled during an operation to the pixel PX and during the standby mode of the pixel PX to be adjusted to allow the input/output characteristics appropriate for respective states during the operation and during the standby mode to be obtained. FIG. 20 is a circuit diagram showing an example of coupling between the CMOS source follower circuit of the pixel and the back-gate control circuit in Embodiment 2. The back-gate control circuit BGC is electrically coupled to the output of the CMOS source follower circuit. The respective back biases (voltages applied to the p⁺-type semiconductor region BGR1 and the n⁺-type semiconductor regions BGR2) to the amplification transistors Qan and Qap can be adjusted in accordance with the output.

Figure 21:
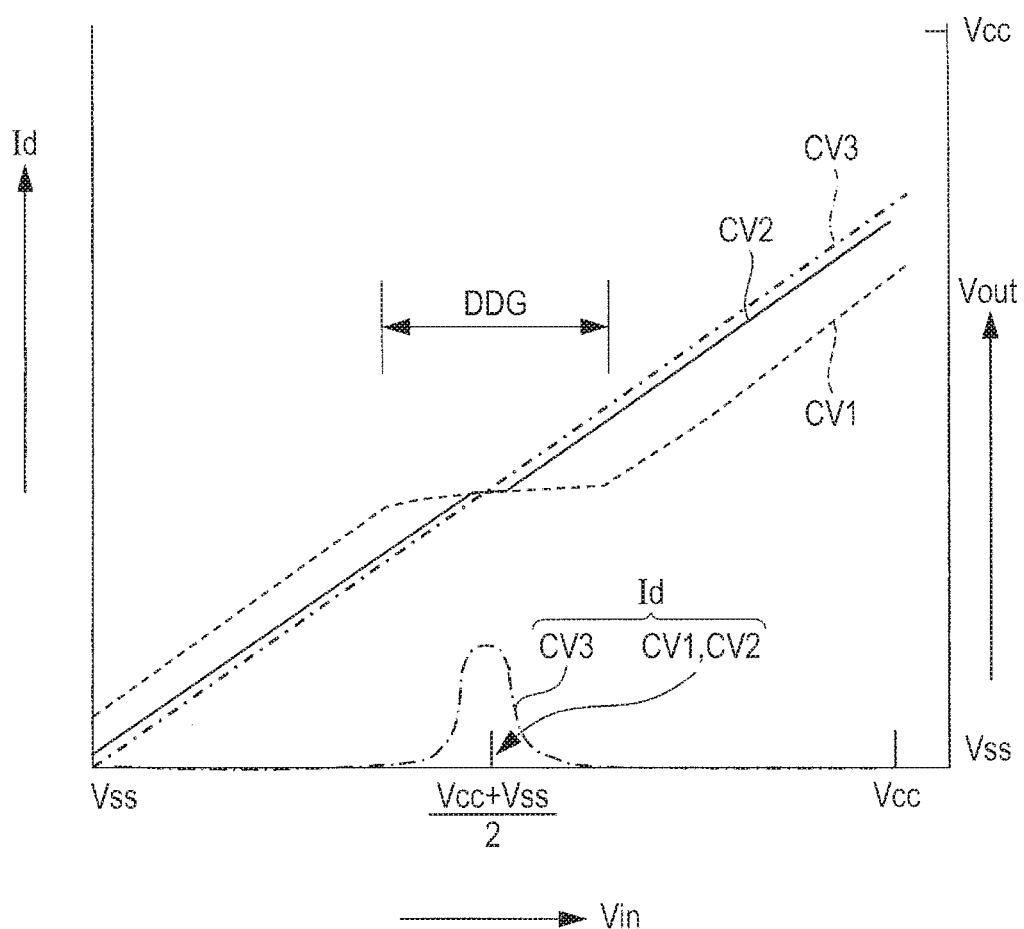
FIG. 21 is a view showing the input/output characteristic of the CMOS source follower circuit in FIG. 20 when a back bias is varied.

FIG. 21 shows the input/output characteristics when the back bias for the CMOS source follower circuit in FIG. 20 is varied. The waveform CV1 shows the input/output characteristic of the CMOS source follower circuit during the standby mode of the pixel PX. In a dead gap region DDG (portion where the output voltage is substantially flat), each of the amplification transistors Qan and Qap is in an OFF state. That is, the input voltage Vin to the CMOS source follower circuit is generated between $(Vcc+Vss)/2-|Vthp|$ and $(Vcc+Vss)/2+Vthn$ so that, at the middle value $(Vcc+Vss)/2$ of the input voltage Vin, no current flows. Thus, in Embodiment 2, the back biases to the amplification transistors Qan and Qap are adjusted such that, during the standby mode of the pixel PX, the waveform CV1 is obtained (i.e., a current scarcely flows in the CMOS source follower circuit). Specifically, the threshold voltage Vtha of each of the amplification transistors Qan and Qap is set to a high value. That is, a negative voltage is applied to the p⁺-type back-gate semiconductor region BGR1 of the amplification transistor Qan, while a positive voltage is applied to the n⁺-type back-gate semiconductor region BGR2 of the amplification transistor Qap. As a result, even when the pixels PX are increased, it is possible to suppress an increase in the power consumption of the solid-state imaging device SS.

On the other hand, each of the waveforms CV2 and CV3 shows the input/output characteristic of the CMOS source follower circuit during a read operation to the pixel PX. In the waveform CV2 shown by the solid line, the respective threshold voltages of the two amplification transistors Qan and Qap are set to 0 (zero) by the back-gate control circuit BGC. This means that, when the input voltage is given by $Vin=(Vcc+Vss)/2$, no current ideally flows. However, actually, due to process-induced fluctuations or the like, the respective threshold voltages of the two amplification transistors Qan and Qap may not be 0 (zero), and consequently an extremely small current may flow depending on the finished values of the threshold voltages of the two amplification transistors Qan and Qap. In this state, in the vicinity of the input voltage given by $Vin=(Vcc+Vss)/2$, no linearity is observed between the input voltage and the output voltage.

Accordingly, in Embodiment 2, during the read operation to the pixel PX, the back biases to the amplification transistors Qan and Qap are adjusted such that the input voltage to and the output voltage from the CMOS source follower circuit are the same and the input/output characteristic is linear. Specifically, in consideration of process-induced fluctuations in the amplification transistors Qan and Qap, the real threshold voltage Vtha of each of the amplification transistors Qan and Qap is set to 0 V or to a value lower than 0 V. That is, a positive voltage is applied to the p⁺-type back-gate semiconductor region BGR1 of the amplification transistor Qan, while a negative voltage is applied to the n⁺-type back-gate semiconductor region BGR2 of the amplification transistor Qap. As a result of such control by the back-gate control circuit BGC, the waveform CV3 is obtained. In this case, around the input voltage given by $Vin=(Vcc+Vss)/2$, a current constantly flows, and the linearity of the output voltage is maintained with respect to all the input voltages. This can achieve the linearity of the input/output characteristic of the CMOS source follower circuit during the reading of charge in the solid-state imaging device SS. Therefore, in the same manner as in Embodiment 1 described above, it is possible to inhibit or prevent the occurrence of distortion in an image even during light illumination at low illuminance. The configuration and the effects are otherwise the same as described above in Embodiment 1.

Modification 1 of Embodiment 2

Figure 22:
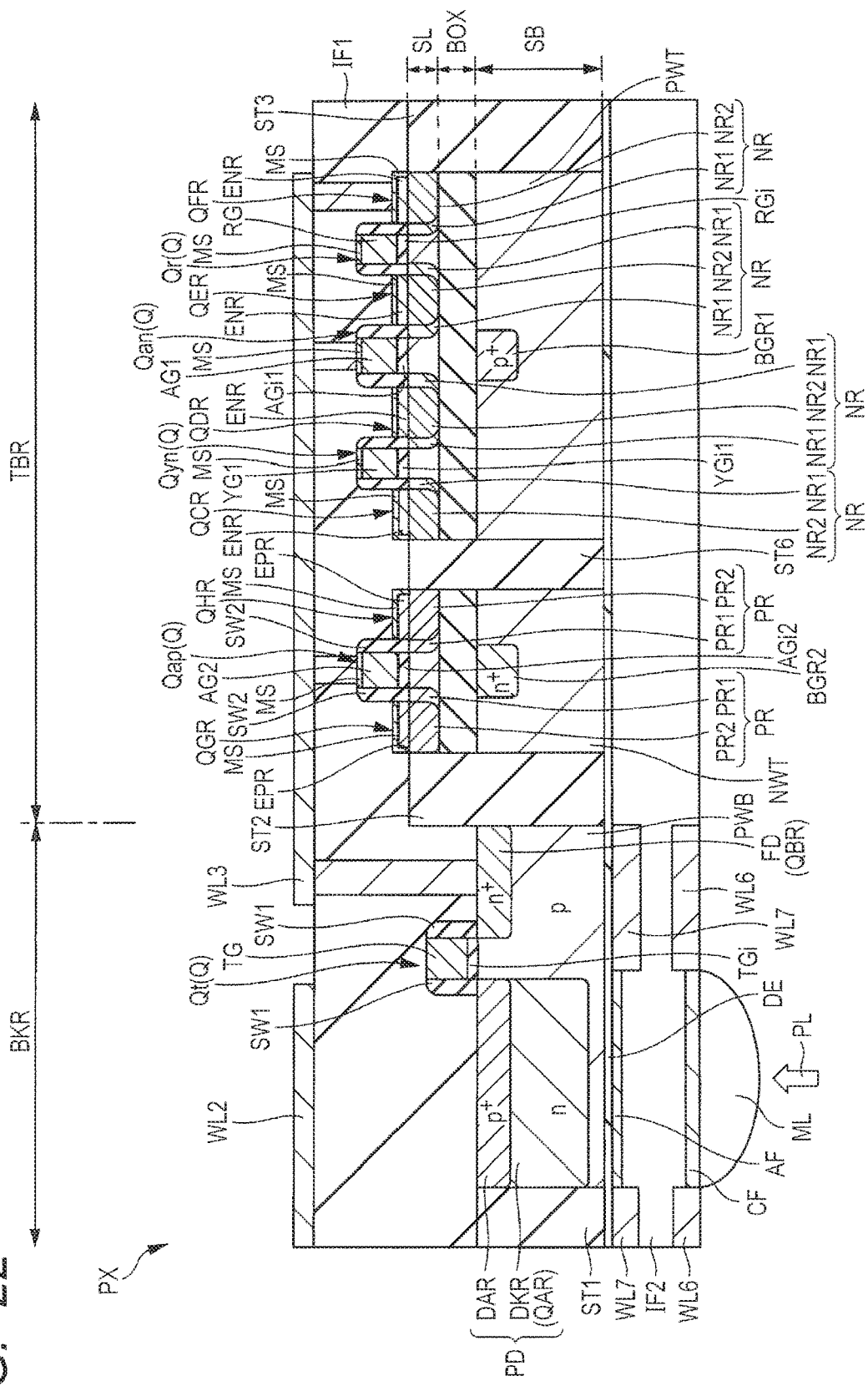
FIG. 22 is a schematic cross-sectional view of a modification of FIG. 18 along the line II-II in FIG. 17.

FIG. 22 is a schematic cross-sectional view of a modification of FIG. 18 along the line II-II in FIG. 17.

Between the p-type well PWT and the n-type well NWT of the substrate SB located in the buried insulating layer region TBR, a trench-type isolation ST6 is formed herein.

The trench-type isolation portion ST6 extends from the main surface of the semiconductor layer SL through the buried insulating layer BOX to reach the back surface of the substrate SB. Thus, the trench-type isolation portion ST6 electrically completely isolates the p-type well PWT and the n-type well NWT from each other.

In this case, since there is no leakage current resulting from a pn junction between the p-type well PWT and the n-type well NWT, power consumption can be reduced compared to that in the structure in FIG. 18. When the pixel transistors Q over the buried insulating layer BOX are operated at high frequencies, a high-speed signal is processed, and the amplification transistors Qan and Qap are controlled with back gates, alternate-current-like (AC-like) coupling between the p-type well PWT and the n-type well can be inhibited. In addition, since the deep n-type well DNW (see FIG. 18) is unnecessary, the number of the process steps is reduced to allow a reduction in manufacturing cost. The configuration and the effects are otherwise the same as described above in Embodiments 1 and 2.

Modification 2 of Embodiment 2

Figure 23:
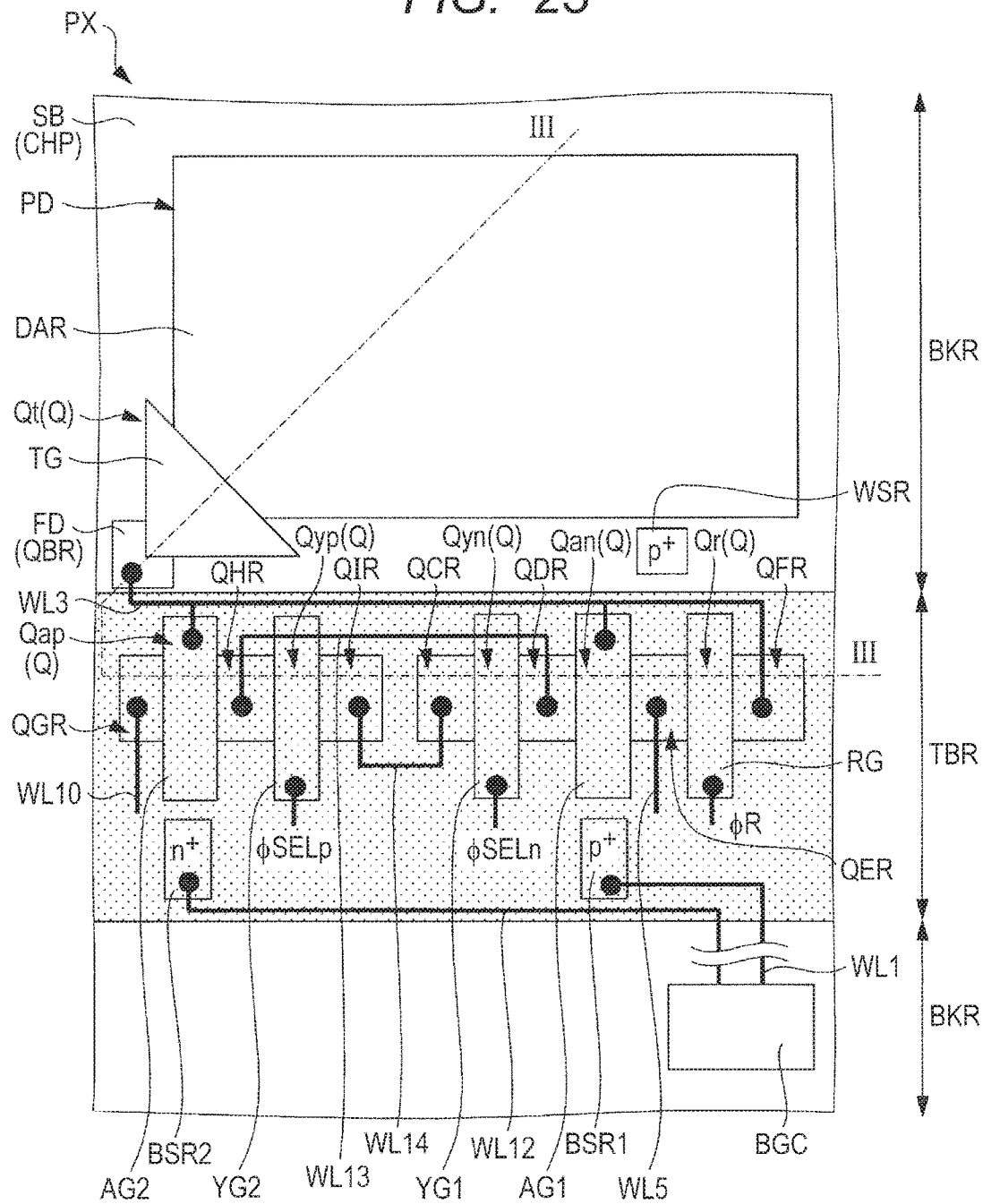
FIG. 23 is an enlarged plan view of the pixel in Modification 2 of Embodiment 2.
Figure 24:
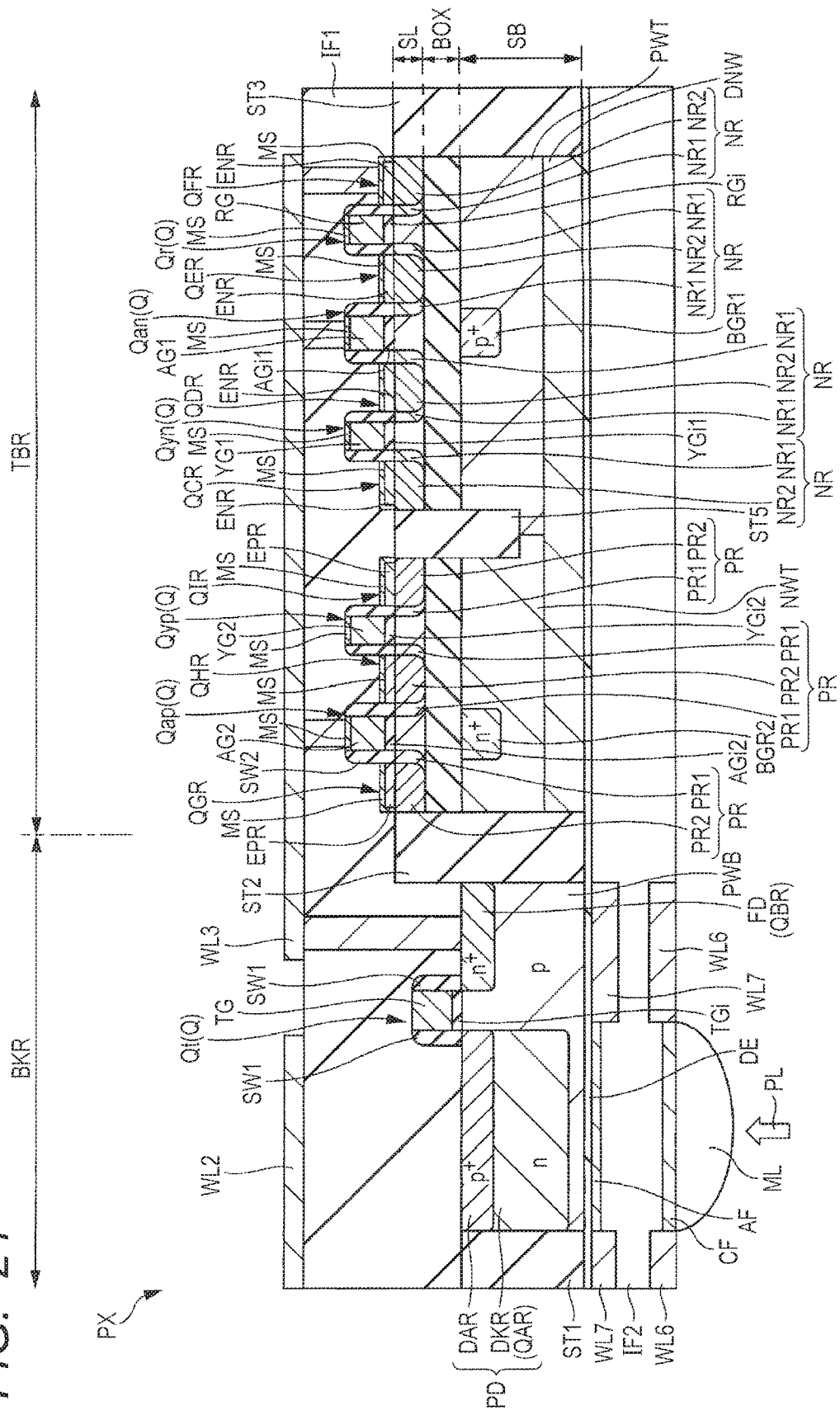
FIG. 24 is a schematic cross-sectional view along the line III-III in FIG. 23.

FIG. 23 is an enlarged plan view of each of the pixels in Modification 2 of Embodiment 2. FIG. 24 is a schematic cross-sectional view along the line III-III in FIG. 23. Note that the wire WL3 is off the line III-III, but is illustrated for the convenience of description.

In Modification 2, as shown in FIGS. 23 and 24, in the semiconductor layer SL located in the buried insulating layer region TBR in the structure illustrated in FIGS. 17 and 18, a p-channel vertical selection transistor Qyp is additionally disposed to be adjacent to the p-channel amplification transistor Qap. The n-channel vertical selection transistor Qyn and the p-channel vertical selection transistor Qyp form a CMOS circuit. That is, the vertical selection transistors form a so-called transmission gate circuit. Note that the symbols φSELn and φSELp in FIG. 23 show vertical selection pulses.

The p-channel vertical selection transistor Qyp is made of, e.g., a p-channel field effect transistor and includes a gate electrode YG2, a gate insulating film YGi2, and the p$^+$-type source/drain semiconductor region QHR and a p$^+$-type source/drain semiconductor region QIR.

The structure of the gate electrode YG2 and the gate insulating film YGi2 is the same as that of the foregoing gate electrode YG1 and the foregoing gate insulating film YGi1. Note that, over the side surfaces of a multi-layer body including the gate insulating film YGi2, the gate electrode YG2, and the silicide layer MS, the sidewall spacers SW2 are formed.

The structure of the p$^+$-type source/drain semiconductor region QIR is the same as that of each of the p$^+$-type semiconductor regions QGR and QHR described above. The p$^+$-type semiconductor region QHR of the p-channel vertical selection transistor Qyp is shared by the p-channel amplification transistor Qap. The p$^+$-type semiconductor region QHR is electrically coupled to the n$^+$-type source/drain semiconductor region QDR of the n-channel vertical selection transistor Qyn through a wire WL13. On the other hand, the p$^+$-type semiconductor region QIR of the p-channel vertical selection transistor Qyp is electrically coupled to the n$^+$-type source/drain semiconductor region QCR of the n-channel vertical selection transistor Qyn through a wire WL14.

In FIG. 17 described above, the n-channel vertical selection transistor Qyn functions as a pass transistor which couples the output terminal of the CMOS source follower circuit to the vertical signal line YL (see FIG. 16 or the like). However, an input voltage to the pass transistor may be shifted by the threshold voltage thereof. In Modification 2, by forming the vertical selection transistor of the transmission gate circuit, the shift equivalent to the threshold voltage can be eliminated. Accordingly, it is possible to improve the operation stability and operation reliability of the solid-state imaging device SS without increasing the gate input voltage to the pass transistor by the threshold voltage. In addition, the advantage of being able to omit a boosting circuit for the foregoing voltage increase and reduce the area occupied by the circuit is also offered. The configuration and the effects are otherwise the same as described above in Embodiments 1 and 2.

Modification of Modification 2

Figure 25:
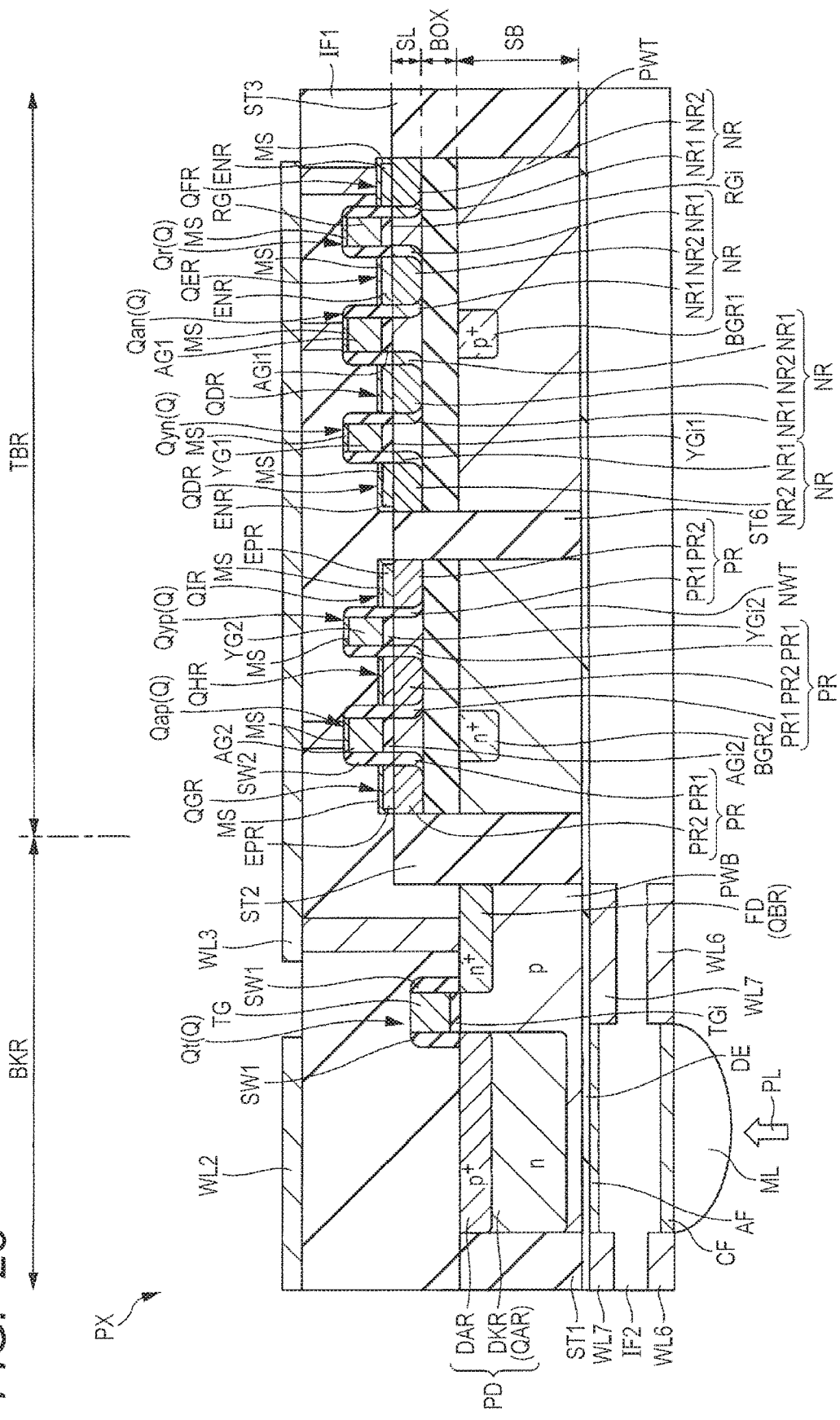
FIG. 25 is a schematic cross-sectional view of a modification of FIG. 24 along the line III-III in FIG. 23.

FIG. 25 is a schematic cross-sectional view of a modification of FIG. 24 along the line III-III in FIG. 23.

In this modification, between the p-type well PWT and the n-type well NWT of the substrate SB located in the buried insulating layer region TBR, the trench-type isolation portion ST6 is formed to extend from the main surface of the semiconductor layer SL to reach the back surface of the substrate SB. Thus, the trench-type isolation portion ST6 electrically completely isolates the p-type well PWT and the n-type well NWT from each other. In this case, in addition to the effects described using FIGS. 23 and 24, the effect described using FIG. 22 can be obtained. The configuration and the effects are otherwise the same as described above in Embodiments 1 and 2.

Embodiment 3

<Example of Configuration of Pixel Using Organic Photoelectric Conversion Element>

Figure 26:
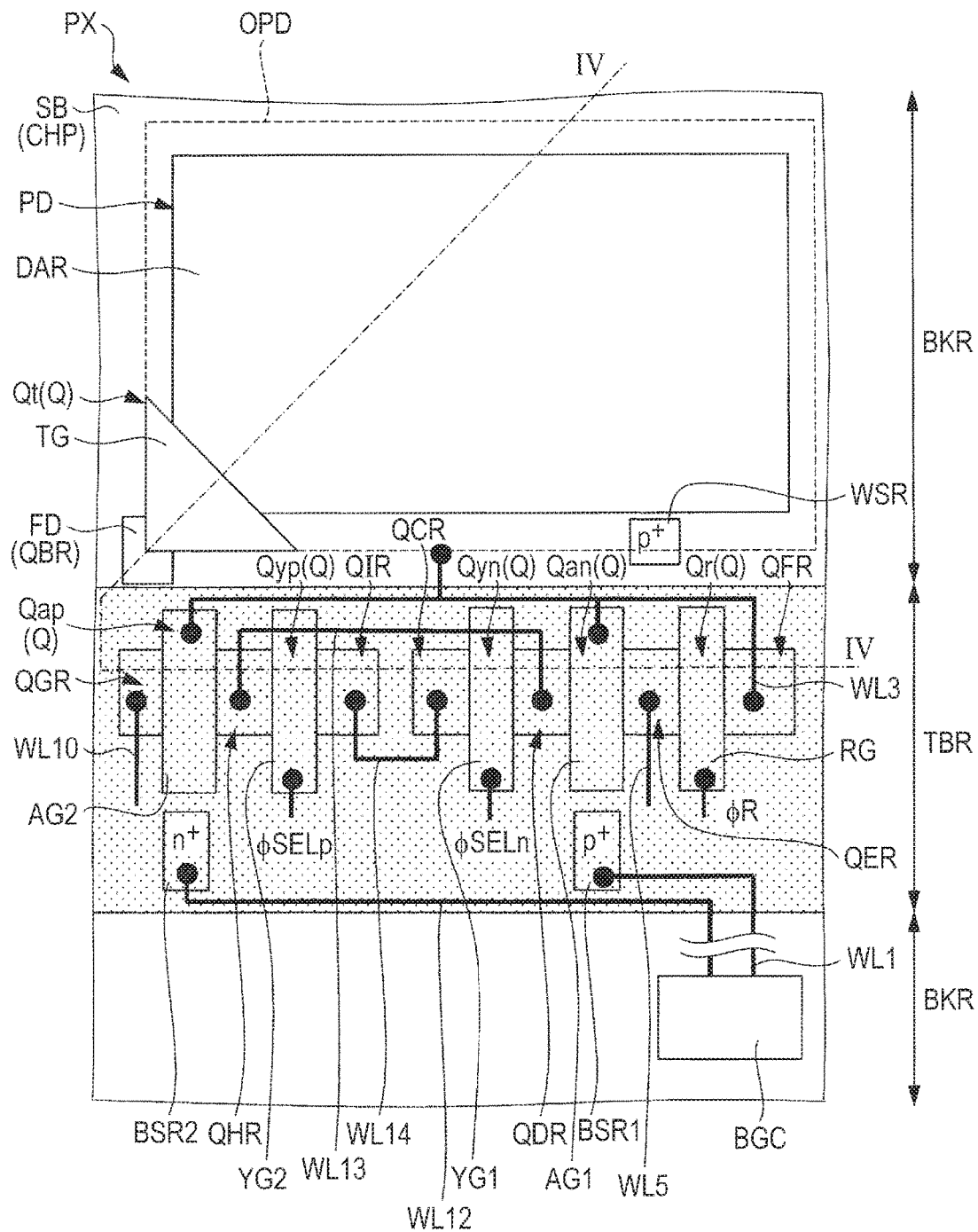
FIG. 26 is an enlarged plan view of each of pixels in Embodiment 3.
Figure 27:
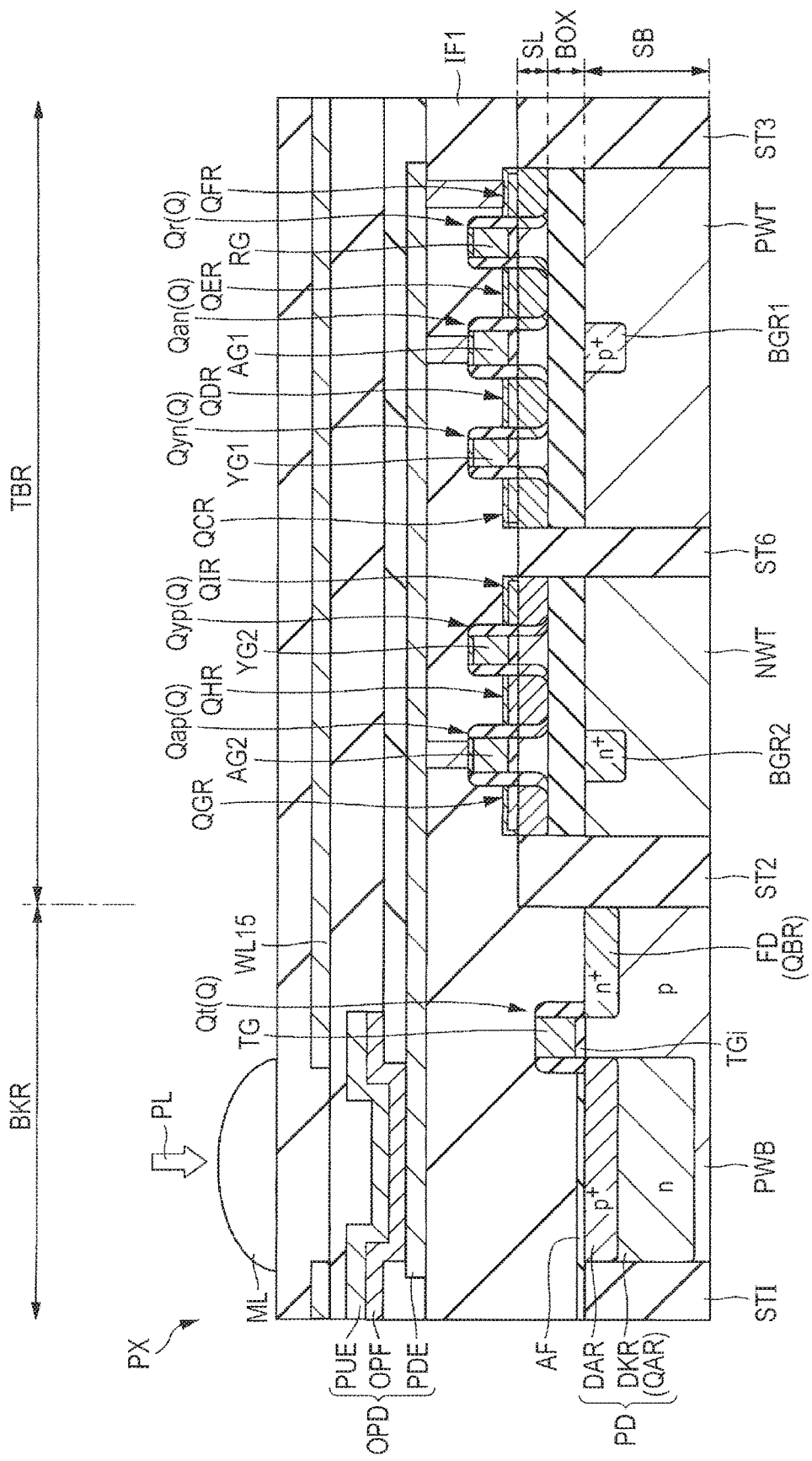
FIG. 27 is a schematic cross-sectional view along the line IV-IV in FIG. 26.

FIG. 26 is an enlarged plan view of each of pixels in Embodiment 3. FIG. 27 is a schematic cross-sectional view along the line IV-IV in FIG. 26.

In Embodiment 3, as shown in FIGS. 26 and 27, a CMOS image sensor of a top side illumination type which causes the incident light PL to be incident on the main surface of the substrate SB is shown by way of example. As a photoelectric conversion element, an organic photoelectric conversion element OPD is used in addition to the photodiode PD. As shown in FIG. 26, the organic photoelectric conversion element OPD is disposed so as to overlap and cover the photodiode PD in plan view. As shown in FIG. 27, the organic photoelectric conversion element OPD is disposed between the micro lens ML and the photodiode PD.

The organic photoelectric conversion element OPD includes a lower electrode PDE, an upper electrode PUE, and an organic photoelectric conversion film OPF interposed therebetween. The organic photoelectric conversion film OPF is formed of an organic material having the property of absorbing (detecting) light in a specified wavelength region which is included in the incident light PL and converting the absorbed light to electrons. For example, the organic photoelectric conversion film OPF which absorbs (detects) light at green wavelengths and converts the absorbed light to electrons is used herein. As the material of the organic photoelectric conversion film OPF, such a known organic material as containing, e.g., a rhodamine-based pigment, a merocyanine-based pigment, quinacridone, or the like is used.

The lower electrode PDE and the upper electrode PUE are formed of, e.g., a known transparent conductive film having light permeability such as, e.g., an indium tin (ITO) film or an indium oxide zinc film. The lower electrode PDE is electrically coupled to the gate electrodes AG1 and AG2 of the amplification transistors Qan and Qap of the CMOS source follower circuit and to the $n^+$-type source semiconductor region QFR of the reset transistor Qr. Note that, between the organic photoelectric conversion film OPF and the photodiode PD, over the main surface of the substrate SB, the antireflection film AF is provided. Over the main surface of the substrate SB located in the buried insulating layer region TBR, a wire WL15 is formed so as to cover the region other than the light reception region. The wire WL15 has a light shielding function which prevents light from entering the region other than the light reception region.

In Embodiment 3, the photodiode PD formed in the substrate SB is configured to absorb (detect) light at wavelengths for a color different from the color detected by the organic photoelectric conversion film OPF (e.g., light at blue or red wavelengths) and convert the absorbed light to charge. Note that, as the pixel transistors (source follower circuit) to which the photodiode PD is coupled, the pixel transistors described above in Embodiments 1 and 2 are disposed at another place. That is, in this case, the floating diffusion FD is electrically coupled via a metal wire to a source follower circuit (not shown) other than the source follower circuit to which the organic photoelectric conversion element OPD is coupled.

According to Embodiment 3, even when the organic photoelectric conversion element OPD is used as the photoelectric conversion element, the same effects as obtained in Embodiments 1 and 2 described above can be obtained. In addition, by disposing the photoelectric conversion elements (the photodiode PD and the organic photoelectric conversion element OPD) which detect light at wavelengths for different colors at the same two-dimensional position in stacked relation in each of the pixels PX, the area occupied by the pixel region PXR can significantly be reduced. This can reduce a chip size. When the chip size is not to be changed, the number of the pixels can significantly be increased and therefore the quality of an image from the solid-state imaging device SS can be improved. The configuration and the effects are otherwise the same as described above in Embodiments 1 and 2. Note that the source follower circuit is formed herein of the CMOS source follower circuit, but the source follower circuit may also be the same as used in Embodiment 1 described above. The vertical selection transistor is formed of the transmission gate circuit, but the vertical selection transistor may also be formed of a single n-channel vertical selection transistor in the same manner as in Embodiment 1 described above.

Embodiment 4

Figure 28:
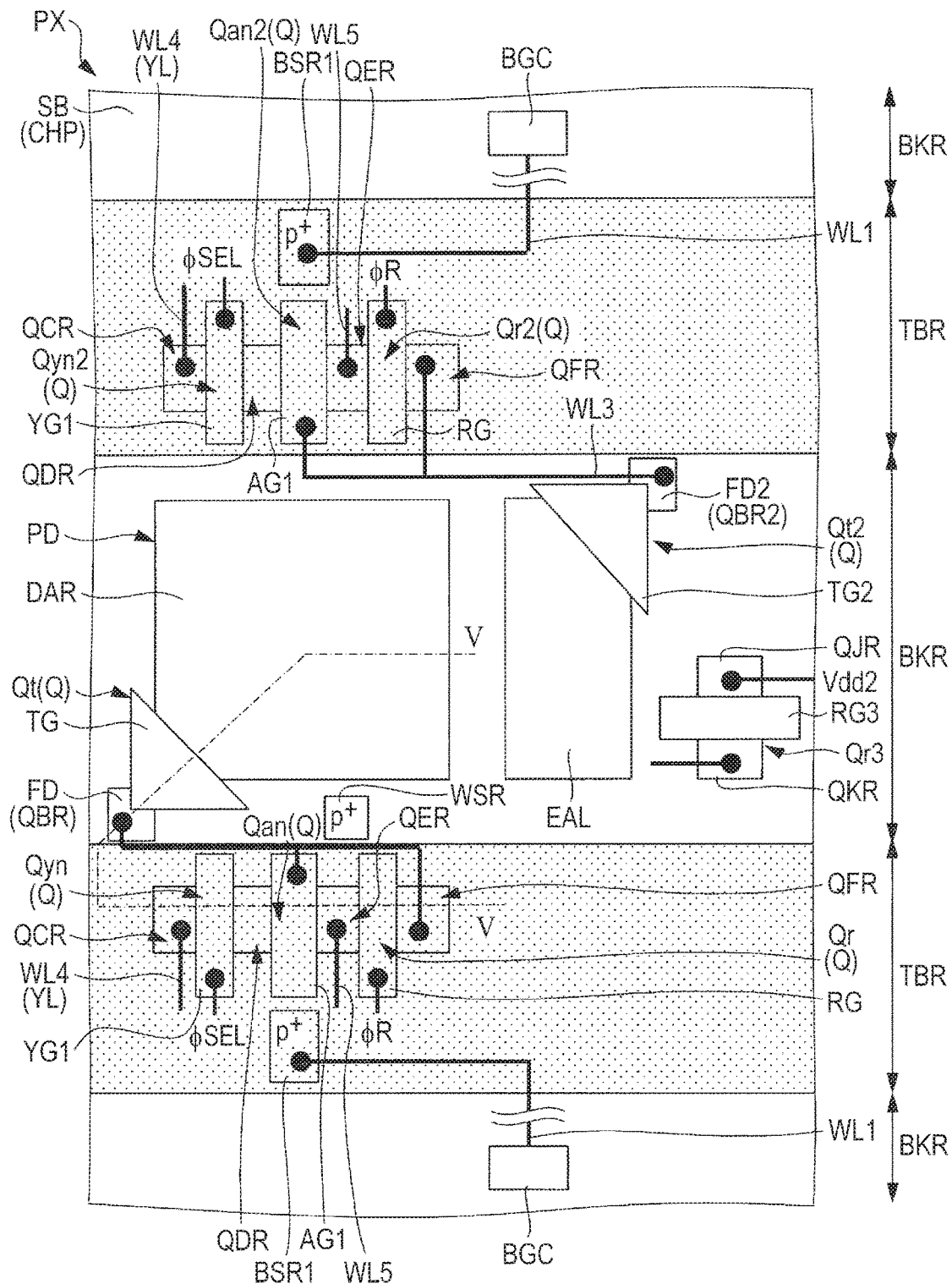
FIG. 28 is an enlarged plan view of each of pixels in Embodiment 4.
Figure 29:
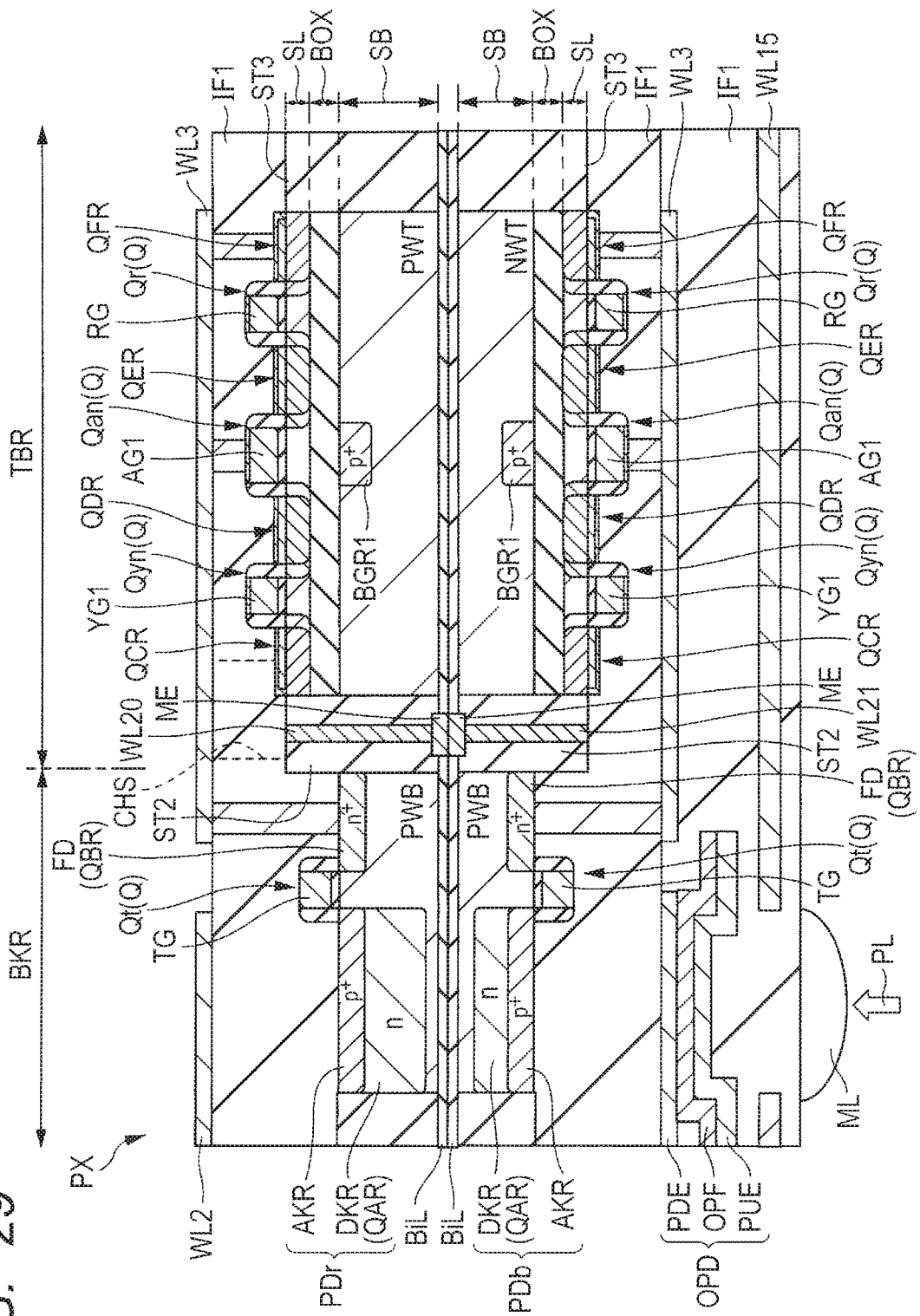
FIG. 29 is a schematic cross-sectional view along the line V-V in FIG. 28.

FIG. 28 is an enlarged plan view of each of pixels in Embodiment 4. FIG. 29 is a schematic cross-sectional view along the line V-V in FIG. 28. Note that FIG. 28 shows an enlarged plan view of the main surface of the upper substrate SB in FIG. 29.

In Embodiment 4, as shown in FIG. 28, a charge storage layer EAL is provided in the substrate SB located in the substrate region BKR. The charge storage layer EAL is the region where charge resulting from conversion in the organic photoelectric conversion element OPD is stored and is electrically coupled to a charge read transistor Qt2. The charge read transistor Qt2 is made of an n-channel field effect transistor and provided in the substrate SB. Note that the reference mark TG2 denotes the gate electrode of the charge read transistor Qt2.

In the buried insulating layer region TBR, the pixel transistors Q (an amplification transistors Qan2, a reset transistor Qr2, and a vertical selection transistor Qyn2) for the organic photoelectric conversion element OPD are disposed. The configuration of the amplification transistor Qan2, the reset transistor Qr2, and the vertical selection transistor Qyn2 is the same as that of the amplification transistor Qan, the reset transistor Qr, and the vertical selection transistor Qyn for the photodiode PD. An $n^+$-type semiconductor region QBR2 (floating diffusion FD2) as one of the $n^+$-type semiconductor regions of the charge read transistor Qt2 for the organic photoelectric conversion element OPD is electrically coupled to the gate electrode AG1 of the amplification transistor Qan2 and to the $n^+$-type semiconductor region QFR of the reset transistor Qr2.

As also shown in FIG. 28, in the substrate region BKR, a reset transistor Qr3 is disposed. The reset transistor Qr3 is intended to reset a voltage in the lower electrode PDE of the organic photoelectric conversion element OPD. The reset transistor Qr3 is made of, e.g., an n-channel field effect transistor and includes a gate electrode RG3, a gate insulating film (not shown), and $n^+$-type source/drain semiconductor regions QJR and QKR. The gate electrode RG3 is made of, e.g., low-resistance polysilicon which is patterned into, e.g., a two-dimensional belt shape. The gate insulating film is made of a silicon dioxide film and formed between the gate electrode RG3 and the substrate SB. Each of the $n^+$-type semiconductor regions QJR and QKR has the same configuration as that of the foregoing $n^+$-type semiconductor region QBR. The $n^+$-type semiconductor region QJR as one of the source/drain regions is electrically coupled to a power supply terminal which supplies a power supply potential Vdd2 through a wire. In general, the power supply potential Vdd2 satisfies Vdd2>Vdd, unlike the power supply potential Vdd for the reset transistor Qr of the photodiode PD. It goes without saying that the power supply potential Vdd2 may also satisfy Vdd2=Vdd or Vdd2<Vdd. The $n^+$-type semiconductor region QKR as the other source/drain region is electrically coupled to the lower electrode PDE (see FIG. 29) of the organic photoelectric conversion element OPD through a wire.

In Embodiment 4, as shown in FIG. 29, the respective back surfaces (second surface and fourth surface) of the two substrates (first substrate and second substrate) SB are hybrid-bonded to each other via respective back-surface insulating films BiL. The hybrid bonding is that bonding of electrodes ME over the respective back surfaces of the substrates SB and bonding of the back-surface insulating films BiL are performed in the same heat treatment process. The electrodes ME are made of, e.g., copper (Cu). The electrodes ME are bonded to each other through interdiffusion during the growth of grains of copper atoms during the heat treatment. The back-surface insulating films BiL are bonded to each other as a result of the formation of silicon-oxygen covalent bonds at the interface therebetween through a dehydration condensation reaction resulting from the heat treatment.

The electrodes ME are electrically coupled to one ends of wires (through wires) WL20 and WL21. The wires WL20 and WL21 are formed in the isolation portions (third isolation portion and fourth isolation portion or seventh isolation portion and eighth isolation portion) ST2. The other ends of the wires WL20 and WL21 are exposed from the upper surfaces of the isolation portions ST2 in the respective main surfaces of the individual substrates SB. The other end of the wire WL20 is electrically coupled to the n+-type semiconductor region QCR of the vertical selection transistor Qyn in one of the substrates SB (upper substrate SB in FIG. 29) through a plug in a contact hole CHS. The plug in the contact hole CHS is made of, e.g., tungsten and buried in the contact hole CHS. The contact hole CHS is formed in the interlayer insulating film IF1 so as to overlap both of the wire WL20 and the n+-type semiconductor region QCR in plan view. The other end of the wire WL21 is electrically coupled to the vertical signal line YL in the other substrate SB (lower substrate SB in FIG. 29). In such a structure, the elements and the wires in the main surface (first surface) of one (upper substrate SB in FIG. 29) of the substrates SB are electrically coupled to the elements and the wires in the main surface (third surface) of the other substrate SB (lower substrate SB in FIG. 29), while the other bonded surfaces are physically bonded to each other. Note that, during the bonding of the substrates SB, the diameter of each of the electrodes ME is set larger than the diameter of each of the wires WL20 and WL21 in consideration of misalignment of the electrodes ME.

The structure of each of the pixels (first pixels) PX of one of the substrates SB is the same as that of each of the pixels (second pixels) PX of the other substrate SB. Also, the buried insulating layer (first insulating layer) BOX and the semiconductor layer (first semiconductor layer) SL of one of the substrates SB located in the buried insulating layer region TBR are the same as the buried insulating layer (second insulating layer) BOX and the semiconductor layer (second semiconductor layer) SL of the other substrate SB located in the buried insulating layer region (third region) TBR. Also, the structure of the vertical selection transistor Qyn, the amplification transistor Qan, and the reset transistor Qr in the main surface of one of the substrates SB is the same as the structure of the vertical selection transistor Qyn, the amplification transistor (fourth field effect transistor) Qan, and the reset transistor Qr in the main surface of the other substrate SB. Also, the structure of the n+-type back-gate semiconductor region (first back-gate semiconductor region) BGR1 of one of the substrates SB is the same as the structure of the n+-type back-gate semiconductor region (second back-gate semiconductor region) BGR1 of the other substrate SB. Also, the structure of the back-gate power supply region (semiconductor region for supplying a first control voltage) BSR1 of one of the substrates SB is the same as the structure of the back-gate power supply region (semiconductor region for supplying a second control voltage) BSR1 of the other substrate SB.

Each of the back-surface insulating films BiL is formed of a single-layer film such as, e.g., a silicon dioxide film, a hafnium oxide film, a silicon nitride film, or an aluminum oxide film or of a multi-layer film thereof. The back-surface insulating film BiL is provided over the entire back surface of each of the substrates SB and transmits light around the main axis of a light path. Accordingly, it may also be possible to allow the back-surface insulating film BiL to have the function of an antireflection film by adjusting the thickness of the back-surface insulating film BiL. This can improve the sensitivity of each of the pixels PX. When the back-surface insulating film (inhibition layer) BiL has a hafnium oxide film, as described above, it is possible to prevent a depletion layer from extending from the n-type semiconductor region DKR of each of the photodiodes PD to the back surface of the substrate SB and thus inhibit or prevent increases in dark currents and dark-time white spots.

In Embodiment 4, the organic photoelectric conversion element OPD, a photodiode (second photoelectric conversion element) PDb (PD), and a photodiode (first photoelectric conversion element) PDr (PD) are arranged in an ascending order in the drawing along the main axis of the light path of the incident light PL.

The organic photoelectric conversion element OPD is configured to perform photoelectric conversion on light at, e.g., green wavelengths. The photodiode PDr in the upper substrate SB located in the substrate region BKR in FIG. 29 is configured to perform photoelectric conversion on, e.g., light at red wavelengths. The photodiode PDb in the lower substrate SB located in the substrate region (fourth region) BKR in FIG. 29 is configured to perform photoelectric conversion on light at, e.g., blue wavelengths. The upper and lower substrates SB have different thicknesses in accordance with the respective wavelengths of light received by the photodiodes PDb and PDr. That is, the upper substrate SB where the photodiode PDr which receives light at red wavelengths is disposed is formed thicker than the lower substrate SB where the photodiode PDb which receives light at blue wavelengths is disposed. Note that the charge read transistor (first field effect transistor) Qt in the main surface of one of the substrates SB and the charge read transistor (third field effect transistor) Qt in the main surface of the other substrate SB are different only in the respective depths of the n-type semiconductor regions DKR and otherwise the same.

The organic photoelectric conversion element OPD and the two photodiodes PDb and PDr are disposed to overlap each other in plan view. That is, the pixels PX in one unit can split light into three colors, i.e., red, green, and blue colors. Since the pixels PX in one unit can split light into the three colors, a color filter is not disposed.

In Embodiment 4, in addition to the effects obtained in Embodiments 1 to 3 described above, the following effect can be obtained. That is, since the pixels PX in one unit allow light to be split into three colors, the area occupied by the pixel region PXR can significantly be reduced. This can reduce the chip size. When the chip size is not to be changed, the number of the pixels can significantly be increased. Pixel information per unit occupied area can be tripled compared to that in a configuration based on a Bayer arrangement in which one pixel provides information on one color. Since the photodiodes PDr and PDb are electrically isolated from each other by the back-surface insulating films BiL, signals for red and blue are not mixed so that the degradation of an image quality due to the mixing of colors (mixed colors) does not occur. Therefore, it is possible to improve the quality of an image from the solid-state imaging device SS. The configuration and the effects are otherwise the same as described above in Embodiments 1 to 3.

Note that, as the source follower circuit, the source follower circuit in Embodiment 1 described above is shown herein by way of example. However, it may also be possible to use a CMOS source follower circuit in the same manner as in Modification 2 described above or the like. In this case, the two substrates SB each having the CMOS follower circuit in the buried insulating layer region TBR are provided as shown by way of example in FIG. 18 or the like, and the respective back surfaces thereof are bonded to each other. That is, the amplification transistor (second field effect transistor) Qa of one (upper substrate SB in FIG. 29) of the substrates SB includes the n-channel amplification transistor Qan (first n-channel field effect transistor) and the p-channel amplification transistor Qap (first p-channel field effect transistor). Also, in the buried insulating layer region TBR of the one of the substrates SB, the p-type well (first p-type semiconductor region) PWT and the n-type well (first n-type semiconductor region) NWT are provided. Between the p-type well PWT and the n-type well NWT, the isolation portion (fifth isolation portion) ST5 is provided. In the p-type well PWT of the one of the substrates SB, the p$^+$-type back-gate semiconductor region (first p-type back-gate semiconductor region) BGR1 is provided while, in the n-type well NWT, the n$^+$-type back-gate semiconductor region (first n-type back-gate semiconductor region) BGR2 is provided. The amplification transistor (fourth field effect transistor) Qa of the other substrate SB (lower substrate SB in FIG. 29) includes the n-channel amplification transistor Qan (second n-channel field effect transistor) and the p-channel amplification transistor Qap (second p-channel field effect transistor). In the buried insulating layer region TBR of the other substrate SB, the p-type well (second p-type semiconductor region) PWT and the n-type well (second n-type semiconductor region) NWT are provided. Between the p-type well PWT and the n-type well NWT also, the isolation portion (sixth isolation portion) ST5 is provided. In the p-type well PWT of the other substrate SB, the p$^+$-type back-gate semiconductor region (second p-type back-gate semiconductor region) BGR1 is provided while, in the n-type well NWT, the n$^+$-type back-gate semiconductor region (second n-type back-gate semiconductor region) BGR2 is provided.

The vertical selection transistor is formed of the single n-channel vertical selection transistor, but may also be formed of a transmission gate circuit in the same manner as in Embodiments 2 and 3 described above.

Modification 1 of Pixel Layout

Figure 30:
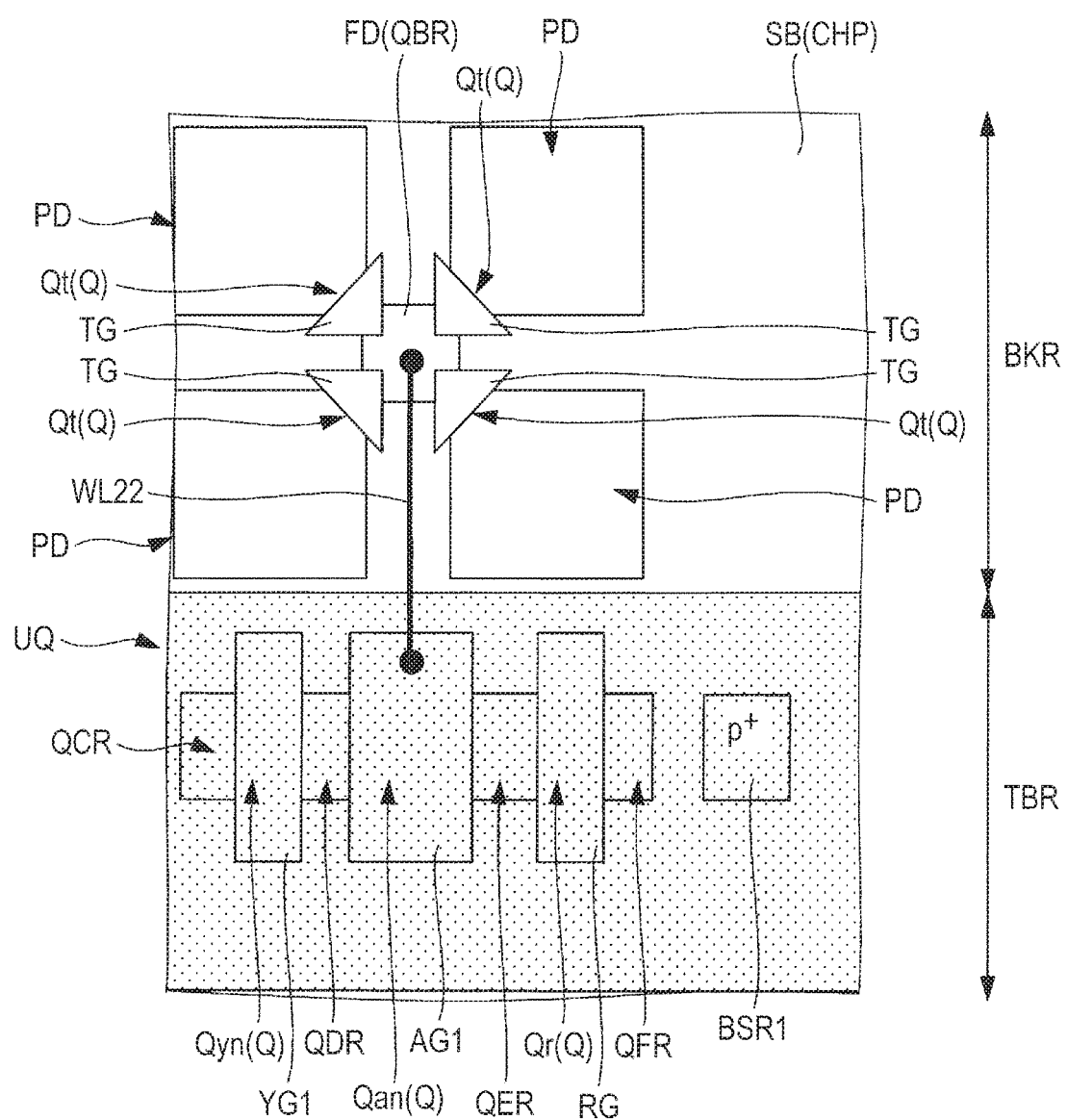
FIG. 30 is an enlarged plan view of a modification of the pixel.

FIG. 30 is an enlarged plan view of Modification 1 of a pixel layout.

In Modification 1, for example, the one floating diffusion FD is shared by the four photodiodes PD. That is, the phototransistors PD are disposed in the vicinities of the four corner portions of the one floating diffusion FD via the charge read transistors Qt. In addition, unit pixel transistors UQ including the vertical selection transistor Qyn, the amplification transistor Qan, and the reset transistor Qr are shared by the four photodiodes PD. This can significantly reduce the area occupied by the pixels and thus reduce the occupied area of the pixel region. When the occupied area of the pixel region is not to be changed, the number of the pixels can significantly be increased.

The amplification transistor Qan is disposed such that the position of the gate electrode AG1 coincides with the position of the floating diffusion FD in a lateral direction in FIG. 30. This allows the gate electrode AG1 of the amplification transistor Qan and the floating diffusion FD to be substantially linearly coupled to each other using a wire WL22. This can reduce the wire length of the wire WL22 and also simplify an overall wire layout. Note that, for improved clarity of illustration, only the wire WL22 is shown herein, while the other wires are omitted, but the state of coupling of the wires is the same as in Embodiment 1 described above. Also, the cross-sectional structure in FIG. 30 is the same as in FIG. 4 or the like.

Figure 31:
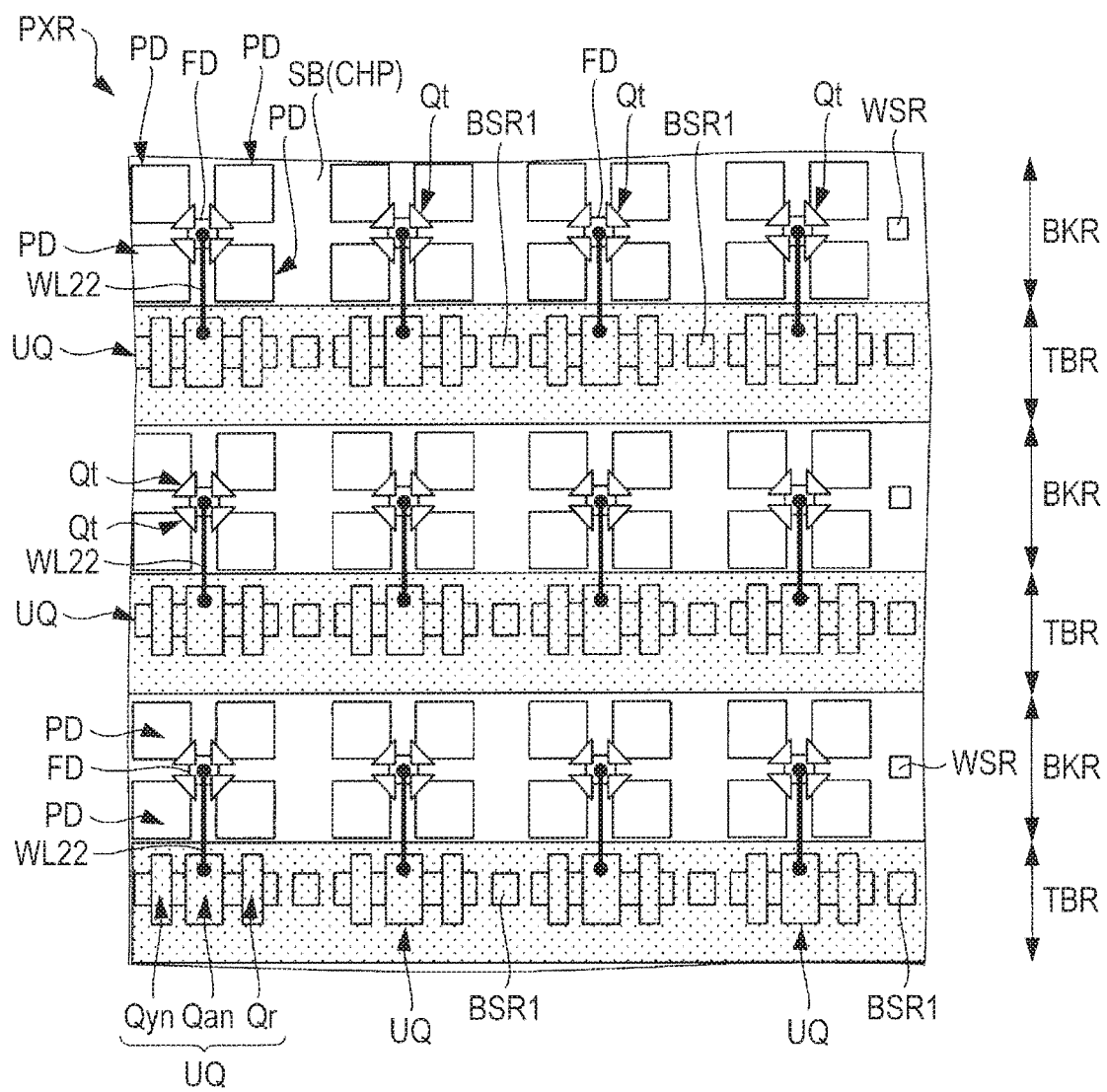
FIG. 31 is a main-portion plan view of a pixel region showing an example of an arrangement of the pixels in FIG. 30.

FIG. 31 is a main-portion plan view of the pixel region, which shows an example of the arrangement of the pixels in FIG. 30.

In the pixel region PXR, the substrate regions BKR and the buried insulating layer regions TBR are regularly alternately arranged along a vertical direction in FIG. 31. Each of the substrate regions BKR and the buried insulating layer regions TBR continuously extends along a lateral direction in FIG. 31.

The four photodiodes PD and the foregoing unit pixel transistors UQ in FIG. 30 are regularly arranged side by side along the lateral direction in FIG. 31. Among them, sets of the four photodiodes PD are disposed in the substrate regions BKR, and the unit pixel transistors UQ are disposed in the buried insulating layer regions TBR.

Each of the well power supply regions WSR is shared by the plurality of photodiodes PD in the substrate region BKR in the same row. That is, the p-type well in the substrate region BKR in the same row is shared by the plurality of photodiodes PD in the substrate region BKR in the same row, and the well power supply region WSR is provided for each one of the shared p-type wells PWB. This can reduce the number of the well power supply regions WSR and thus reduce the occupied area of the pixel region PXR.

The configuration and the effects are otherwise the same as described above in Embodiment 1. Note that, as the source follower circuit, the source follower circuit in Embodiment 1 described above is shown herein by way of example. However, in the same manner as in Modification 2 described above or the like, a CMOS source follower circuit may also be used. The vertical selection transistor is formed of the single n-channel vertical selection transistor but, in the same manner as in Embodiments 2 and 3 described above, a transmission gate circuit may also be used. In the same manner as in Embodiments 3 and 4 described above, an organic photoelectric conversion element may also be provided. In the same manner as in Embodiment 4 described above, a configuration in which the two substrates SB are bonded together may also be used.

Modification 2 of Pixel Layout

Figure 32:
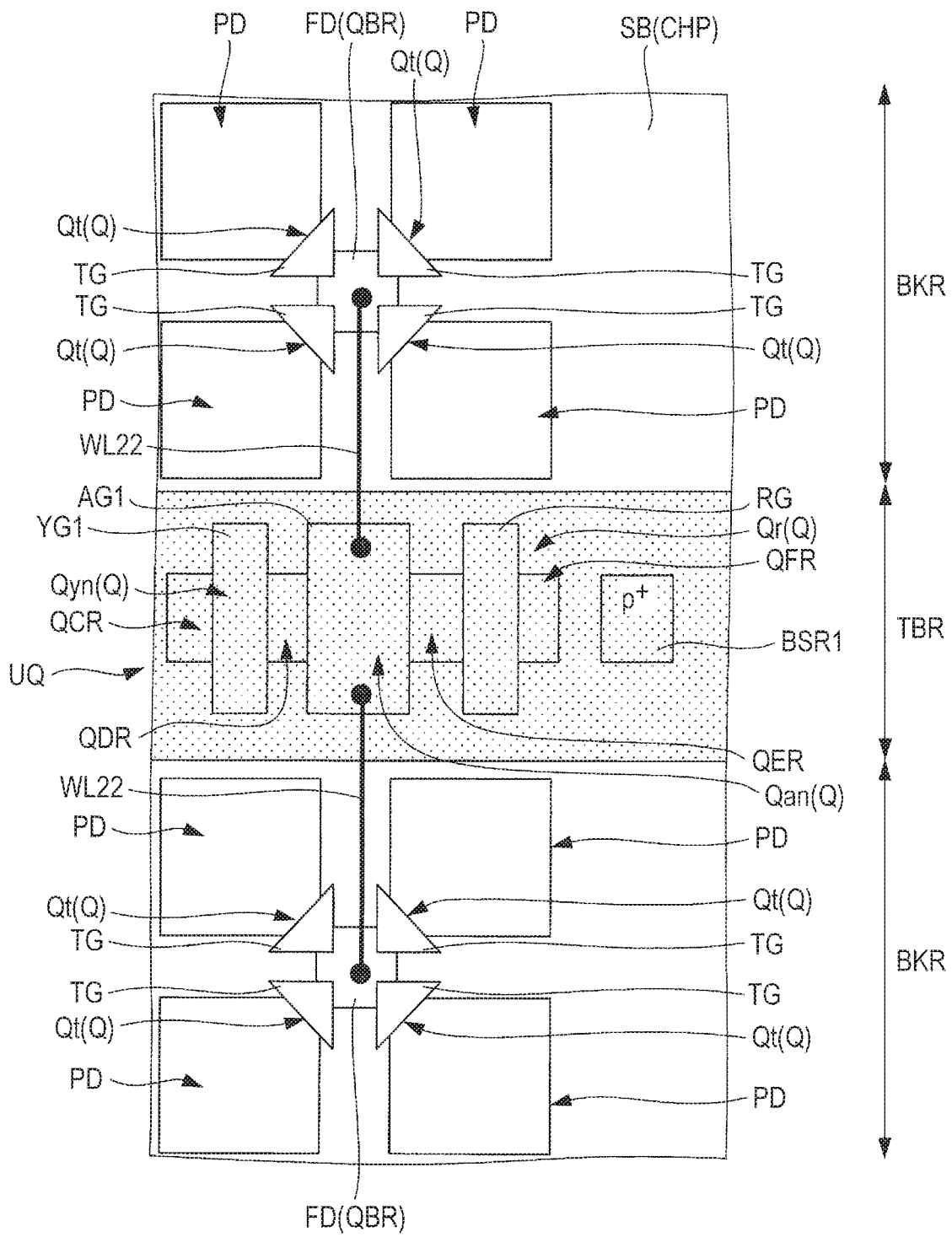
FIG. 32 is an enlarged plan view of a modification of the pixel.

FIG. 32 is an enlarged plan view of a modification of each of the pixels.

In Modification 2, the unit pixel transistors UQ including the vertical selection transistor Qyn, the amplification transistor Qan, and the reset transistor Qr are shared by the eight photodiodes PD. That is, the sets of the four photodiodes described above are disposed such that the unit pixel transistors UQ are interposed therebetween. In other words, the unit pixel transistors UQ are disposed between the sets of the four photodiodes PD. This provides the configuration in which one set of the unit pixel transistors UQ can be used by the eight photodiodes PD.

Figure 33:
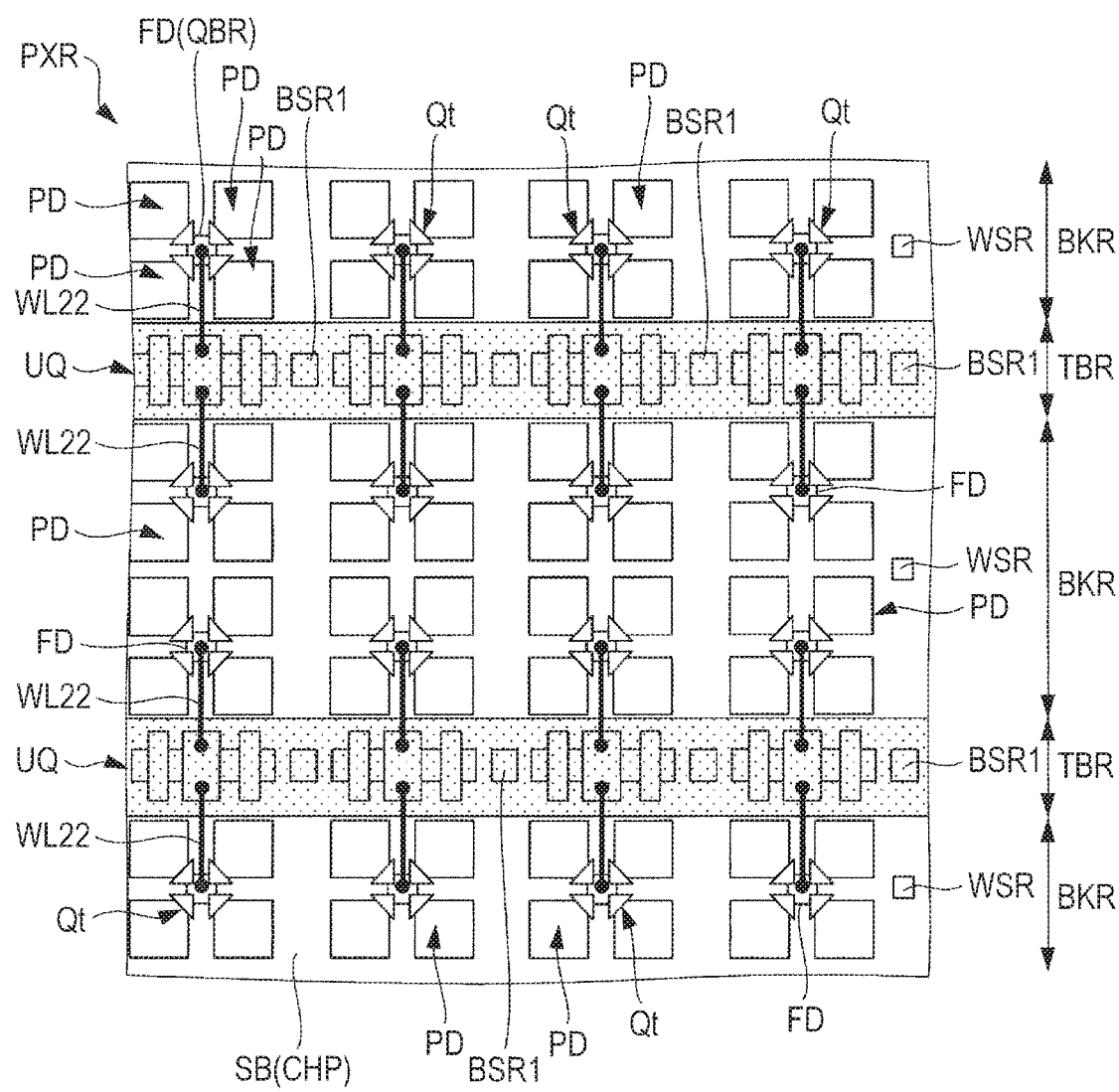
FIG. 33 is a main-portion plan view of the pixel region showing an example of an arrangement of the pixels in FIG. 32.

FIG. 33 is a main-portion plan view of the pixel region, which shows an example of the arrangement of the pixels in FIG. 32.

In FIG. 33, between the buried insulating layer regions TBR which are adjacent to each other in a vertical direction in FIG. 33, the sets the four photodiodes PD are arranged in two rows. In this case, the buried insulating layer region TBR corresponding to one row in FIG. 31 can be eliminated. In addition, the number of the well power supply regions WSR can be reduced compared to that in the case of FIG. 31. Accordingly, the occupied area of the pixel region PXR can be reduced compared to that in the case of FIG. 31. When the occupied area of the pixel region PXR is not to be changed, the number of the pixels can be increased compared to that in the case of FIG. 31.

The configuration and the effects are otherwise the same as described above in Embodiment 1. Note that, in this case also, as the source follower circuit, a CMOS source follower circuit may be used in the same manner as in Modification 2 described above or the like. Also, as the vertical selection transistor, a transmission gate circuit may be used in the same manner as in Embodiments 2 and 3 described above. Also, in the same manner as in Embodiments 3 and 4 described above, an organic photoelectric conversion element may be provided. Also, in the same manner as in Embodiment 4 described above, the configuration in which the two substrates SB are bonded together may be used.

Modification 3 of Pixel Layout

Figure 34:
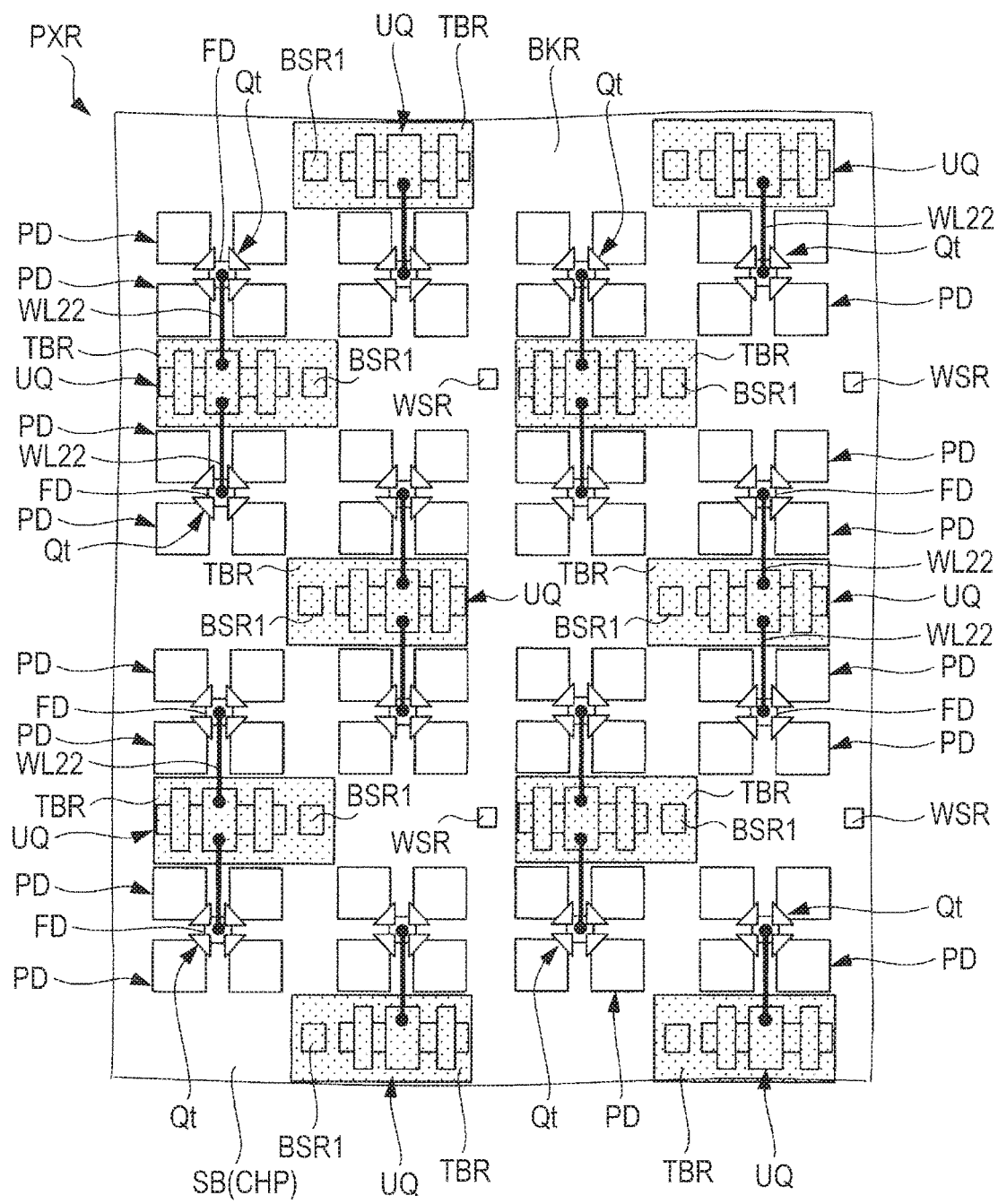
FIG. 34 is a main-portion plan view of the pixel region showing a modification of a layout of the pixels.

FIG. 34 is a main-portion plan view of the pixel region, which shows a modification of the arrangement of the pixels in FIG. 32.

In Modification 3, the pixels in FIG. 32 are arranged in a staggered configuration. That is, the positions of the pixels adjacent to each other in a lateral direction in FIG. 34 are shifted in a vertical direction in FIG. 34. In addition, the buried insulating layer region TBR is divided into a plurality of regions which are arranged in scattered relation. In other words, the plurality of buried insulating layer regions TBR are arranged to be spaced apart from each other. In the case of the SOTB structure in the buried insulating layer region TBR, the semiconductor layer SL (see FIG. 4 or the like) is thin, and the buried insulating layer BOX (see FIG. 4 or the like) is present under the unit pixel transistors UQ. Accordingly, the dissipation property of the heat generated in the unit pixel transistors UQ deteriorates compared to that in the transistors provided in the substrate SB. By contrast, in Modification 3, the buried insulating layer regions TBR are arranged in scattered relation to allow an improvement in the dissipation property of heat from the unit pixel transistors UQ provided in the buried insulating layer regions TBR. Therefore, it is possible to improve the reliability of the operation of the unit pixel transistors UQ provided in the buried insulating layer regions TBR.

Figure 35:
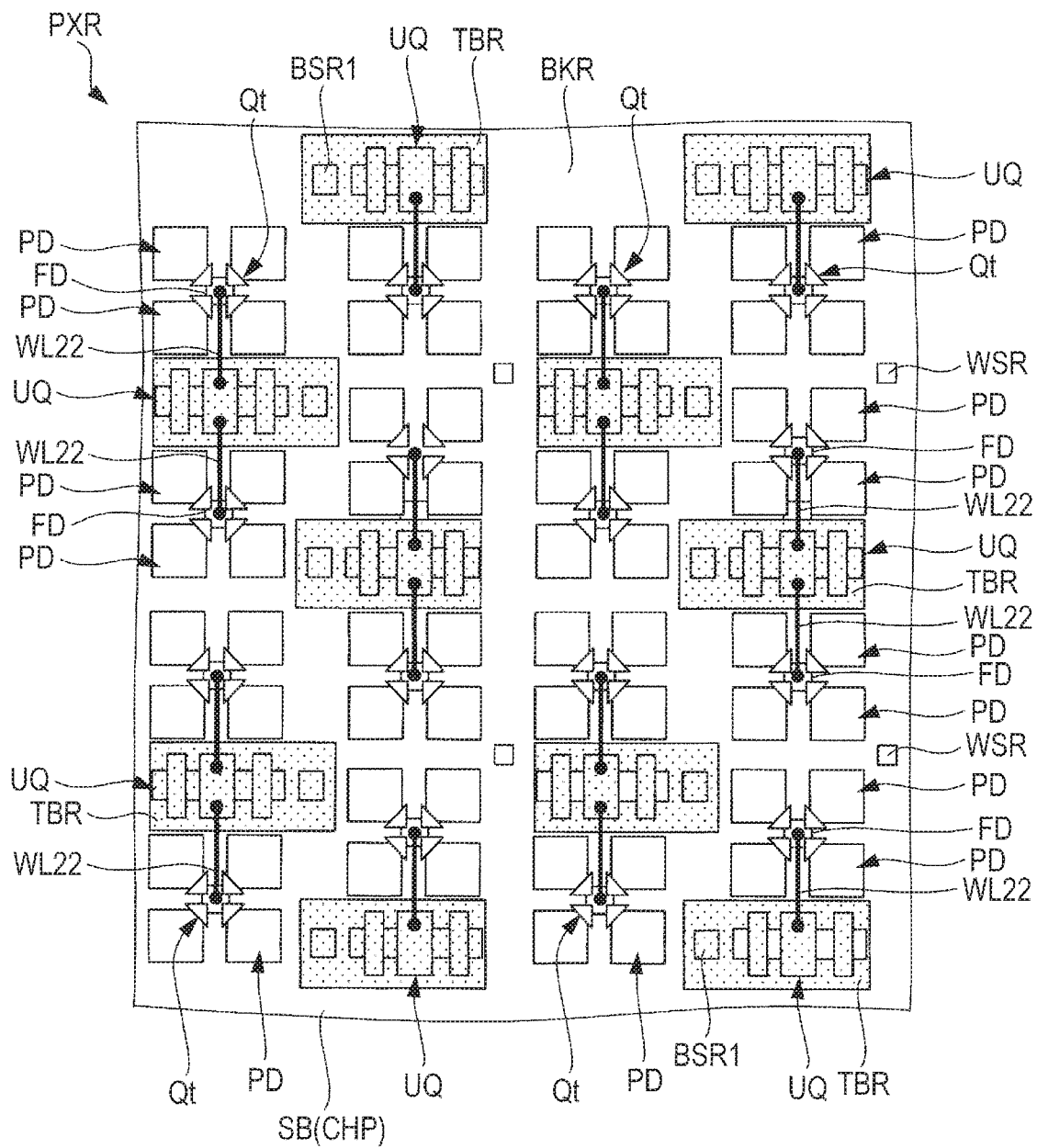
FIG. 35 is a main-portion plan view of the pixel region showing a modification of the layout of the pixels.

FIG. 35 is a main-portion plan view of the pixel region, which shows a modification of the pixel layout in FIG. 34.

In FIG. 35, the intervals between the pixels adjacent to each other in a vertical direction are smaller than in FIG. 34. In this case, the same effects as obtained from the pixel layout in FIG. 34 can be obtained and, in addition, the occupied area of the pixel region PXR can be reduced compared to that in the pixel layout in FIG. 34.

The configuration and the effects are otherwise the same as in Embodiment 1 described above. Note that, in the case of FIGS. 34 and 35 also, as the source follower circuit, a CMOS source follower circuit may be used in the same manner as in Modification 2 described above or the like. Also, as the vertical selection transistor, a transmission gate circuit may be used in the same manner as in Embodiments 2 and 3 described above. Also, in the same manner as in Embodiments 3 and 4 described above, an organic photoelectric conversion element may be provided. Also, in the same manner as in Embodiment 4 described above, the configuration in which the two substrates SB are bonded together may be used.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

For example, the present invention is applicable to another semiconductor device in which, in addition to the solid-state imaging element, integrated circuits such as a memory and a CPU (Central Processing Unit) are disposed in the same chip.

What is claimed is:

1. A semiconductor device, comprising:
   a semiconductor substrate having a first surface and a second surface opposite to the first surface; and
   a plurality of pixels disposed in the first surface of the semiconductor substrate,
   wherein each of the pixels includes:
   a photoelectric conversion element which converts incident light to charge;
   a first field effect transistor coupled in series to the photoelectric conversion element; and
   a second field effect transistor having a gate electrode coupled to an output of the first field effect transistor,
   wherein the first surface of the semiconductor substrate has:
   a first region where a semiconductor layer is provided over the first surface via an insulating layer; and
   a second region where the insulating layer and the semiconductor layer are not provided over the first surface,
   wherein the photoelectric conversion element and the first field effect transistor are provided in the semiconductor substrate located in the second region,
   wherein the second field effect transistor is provided in the semiconductor layer in the first region, and
   wherein, in the semiconductor substrate located in the first region, a back-gate semiconductor region for controlling a threshold voltage of the second field effect transistor is provided.

2. The semiconductor device according to claim 1, wherein, in the semiconductor layer, a control voltage supply semiconductor region which supplies a control voltage to the back-gate semiconductor region is provided.

3. The semiconductor device according to claim 1, wherein, in the semiconductor substrate, a first isolation portion is provided at a boundary between the first region and the second region.

4. The semiconductor device according to claim 1, wherein, in the second surface of the semiconductor substrate, an inhibition layer which inhibits a depletion layer from extending from the photoelectric conversion element to the second surface is provided.

5. The semiconductor device according to claim 4, wherein the inhibition layer contains Hf and O as main components.

6. The semiconductor device according to claim 1, wherein, over the second surface of the semiconductor substrate, a light shielding layer is provided so as to cover a region other than a light reception region for the incident light.

7. The semiconductor device according to claim 1, wherein the second field effect transistor is formed of a complementary source follower circuit including an n-channel field effect transistor and a p-channel field effect transistor,
   wherein, in the semiconductor substrate located in a region where the n-channel field effect transistor is disposed, a p-type semiconductor region is provided,
   wherein, in the semiconductor substrate located in a region where the p-channel field effect transistor is disposed, an n-type semiconductor region is provided adjacent to the p-type semiconductor region, and
   wherein the back-gate semiconductor region includes:

a p-type back-gate semiconductor region provided in the p-type semiconductor region so as to overlap a gate electrode of the n-channel field effect transistor in plan view; and an n-type back-gate semiconductor region provided in the n-type semiconductor region so as to overlap a gate electrode of the p-channel field effect transistor in plan view.

8. The semiconductor device according to claim 7, wherein, at a boundary between the p-type semiconductor region and the n-type semiconductor region, a second isolation portion is provided.

9. The semiconductor device according to claim 1, wherein, over the first surface of the semiconductor substrate, an organic photoelectric conversion element which detects light in a color different from that of light detected by the photoelectric conversion element is disposed so as to overlap the photoelectric conversion element in plan view.

10. A semiconductor device, comprising:

a first semiconductor substrate having a first surface and a second surface opposite to the first surface; and a plurality of first pixels disposed in the first surface of the first semiconductor substrate, wherein each of the first pixels includes:

a first photoelectric conversion element which converts incident light to charge;

a first field effect transistor coupled in series to the first photoelectric conversion element; and a second field effect transistor having a gate electrode coupled to an output of the first field effect transistor, wherein the first surface of the first semiconductor substrate has:

a first region where a first semiconductor layer is provided over the first surface via a first insulating layer; and a second region where the first insulating layer and the first semiconductor layer are not provided over the first surface, wherein the first photoelectric conversion element and the first field effect transistor are provided in the first semiconductor substrate located in the second region, wherein the second field effect transistor is provided in the first semiconductor layer in the first region, wherein, in the first semiconductor substrate located in the first region, a first back-gate semiconductor region for controlling a threshold voltage of the second field effect transistor is provided so as to overlap a gate electrode of the second field effect transistor in plan view, the semiconductor device further comprising:

a second semiconductor substrate having a third surface and a fourth surface opposite to the third surface; and a plurality of second pixels disposed in the third surface of the second semiconductor substrate, wherein each of the second pixels includes:

a second photoelectric conversion element which detects light in a color different from that of light detected by the first photoelectric conversion element and converts the detected light to charge;

a third field effect transistor coupled in series to the second photoelectric conversion element; and a fourth field effect transistor having a gate electrode coupled to an output of the third field effect transistor, wherein the third surface of the second semiconductor substrate has:

a third region where a second semiconductor layer is provided over the third surface via a second insulating layer; and a fourth region where the second insulating layer and the second semiconductor layer are not provided over the third surface, wherein the second photoelectric conversion element and the third field effect transistor are provided in the second semiconductor substrate located in the fourth region, wherein the fourth field effect transistor is provided in the second semiconductor layer in the third region, wherein, in the second semiconductor substrate located in the third region, a second back-gate semiconductor region for controlling a threshold voltage of the fourth field effect transistor is provided so as to overlap a gate electrode of the fourth field effect transistor in plan view, and wherein the second surface of the first semiconductor substrate and the fourth surface of the second semiconductor substrate are bonded to each other in a state where the first photoelectric conversion element and the second photoelectric conversion element overlap each other in plan view.

11. The semiconductor device according to claim 10, wherein the first semiconductor substrate and the second semiconductor substrate have different thicknesses.

12. The semiconductor device according to claim 10, wherein, in the first semiconductor layer, a first control voltage supply semiconductor region which supplies a control voltage to the first back-gate semiconductor region is provided, and wherein, in the second semiconductor layer, a second control voltage supply semiconductor region which supplies a control voltage to the second back-gate semiconductor region is provided.

13. The semiconductor device according to claim 10, wherein, in the first semiconductor substrate, a third isolation portion is provided at a boundary between the first region and the second region, and wherein, in the second semiconductor substrate, a fourth isolation portion is provided at a boundary between the third region and the fourth region.

14. The semiconductor device according to claim 10, wherein, between the second surface of the first semiconductor substrate and the fourth surface of the second semiconductor substrate, an inhibition layer which inhibits a depletion layer from extending from the first photoelectric conversion element to the second surface and inhibits a depletion layer from extending from the second photoelectric conversion element to the fourth surface is provided.

15. The semiconductor device according to claim 14, wherein the inhibition layer contains Hf and O as main components.

16. The semiconductor device according to claim 10, wherein the second field effect transistor is formed of a complementary source follower circuit including a first n-channel field effect transistor and a first p-channel field effect transistor, wherein, in the first semiconductor substrate located in a region where the first n-channel field effect transistor is disposed, a first p-type semiconductor region is provided, wherein, in the first semiconductor substrate located in a region where the first p-channel field effect transistor is disposed, a first n-type semiconductor region is provided adjacent to the first p-type semiconductor region, wherein the first back-gate semiconductor region includes:

a first p-type back-gate semiconductor region provided in the first p-type semiconductor region so as to overlap a gate electrode of the first n-channel field effect transistor in plan view; and a first n-type back-gate semiconductor region provided in the first n-type semiconductor region so as to overlap a gate electrode of the first p-channel field effect transistor in plan view, wherein the fourth field effect transistor is formed of a complementary source follower circuit including a second n-channel field effect transistor and a second p-channel field effect transistor, wherein, in the second semiconductor substrate located in a region where the second n-channel field effect transistor is disposed, a second p-type semiconductor region is provided, wherein, in the second semiconductor substrate located in a region where the second p-channel field effect transistor is disposed, a second n-type semiconductor region is provided adjacent to the second p-type semiconductor region, and wherein the second back-gate semiconductor region includes:

a second p-type back-gate semiconductor region provided in the second p-type semiconductor region so as to overlap a gate electrode of the second n-channel field effect transistor in plan view; and a second n-type back-gate semiconductor region provided in the second n-type semiconductor region so as to overlap a gate electrode of the second p-channel field effect transistor in plan view.

17. The semiconductor device according to claim 16, wherein, at a boundary between the first p-type semiconductor region and the first n-type semiconductor region, a fifth isolation portion is provided, and wherein, at a boundary between the second p-type semiconductor region and the second n-type semiconductor region, a sixth isolation portion is provided.

18. The semiconductor device according to claim 10, wherein, in the first semiconductor substrate, a seventh isolation portion extending from a main surface of the first semiconductor layer and reaching the second surface is provided, wherein, in the second semiconductor substrate, an eighth isolation portion extending from a main surface of the second semiconductor layer and reaching the fourth surface is provided so as to overlap the seventh isolation portion in plan view, and wherein, in the seventh isolation portion and the eighth isolation portion, respective through wires extending through the main surface of the first semiconductor layer and the main surface of the second semiconductor layer are formed.

19. The semiconductor device according to claim 10, wherein, in a path of the incident light, an organic photoelectric conversion element which detects light in a color different from that of light detected by each of the first photoelectric conversion element and the second photoelectric conversion element is disposed so as to overlap the first photoelectric conversion element and the second photoelectric conversion element in plan view.

* * * * *